(12) United States Patent
Hyun et al.

(10) Patent No.: US 10,008,252 B2
(45) Date of Patent: Jun. 26, 2018

(54) SEMICONDUCTOR SYSTEM CAPABLE OF STORING DIFFERENT SETTING INFORMATION IN PLURALITY OF SEMICONDUCTOR CHIPS SHARING COMMAND/ADDRESS INFORMATION

(71) Applicant: SK hynix Inc., Gyeonggi-do (KR)

(72) Inventors: Sang-Ah Hyun, Chungcheongbuk-do (KR); Tae-Jin Kang, Gyeonggi-do (KR); Hyun-Seung Kim, Gyeonggi-do (KR); Nam-Kyu Jang, Gyeonggi-do (KR); Won-Seok Choi, Seoul (KR); Won-Kyung Chung, Gyeonggi-do (KR); Seung-Hun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/477,619

(22) Filed: Apr. 3, 2017

(65) Prior Publication Data

US 2018/0061472 A1 Mar. 1, 2018

(30) Foreign Application Priority Data

Aug. 31, 2016 (KR) ........................ 10-2016-0111757

(51) Int. Cl.
| | |
|---|---|
| *G11C 7/00* | (2006.01) |
| *G11C 11/35* | (2006.01) |
| *G11C 7/22* | (2006.01) |
| *G11C 11/404* | (2006.01) |
| *G11C 11/406* | (2006.01) |

(Continued)

(52) U.S. Cl.
CPC ............... *G11C 11/35* (2013.01); *G11C 7/22* (2013.01); *G11C 11/404* (2013.01); *G11C 11/4082* (2013.01); *G11C 11/4093* (2013.01); *G11C 11/40607* (2013.01)

(58) Field of Classification Search
CPC . G11C 11/35; G11C 11/4093; G11C 11/4082; G11C 11/404; G11C 7/22; G11C 11/40607
USPC .......................................... 365/191, 51, 63
See application file for complete search history.

(56) References Cited

U.S. PATENT DOCUMENTS 7,391,634 B2 * 6/2008 Kim ....................... G11C 7/22
365/51
2014/0189224 A1 7/2014 Kostinsky et al.
(Continued)

*Primary Examiner* — David Lam
(74) *Attorney, Agent, or Firm* — IP & T Group LLP

(57) ABSTRACT

A semiconductor system may include: an external channel including a CA (Command/Address) channel, and first and second data channels; and first and second semiconductor chips, which are coupled in common to the CA channel and coupled to respective different ones of the first and second data channels, and each of which includes a coupling information pad. A first value may be inputted to the coupling information pad of one of the first and second semiconductor chips that is coupled to the first data channel, and a second value may be inputted to the coupling information pad of the other semiconductor chip that is coupled to the second data channel. Each of the first and second semiconductor chips selectively stores setting information using CA information applied to the CA channel and a value inputted to the corresponding coupling information pad.

26 Claims, 14 Drawing Sheets

(51) Int. Cl.
*G11C 11/408* (2006.01)
*G11C 11/4093* (2006.01)

(56) References Cited

U.S. PATENT DOCUMENTS

2015/0310931 A1 10/2015 Lee
2016/0181214 A1* 6/2016 Oh .......................... H01L 45/04
257/777

* cited by examiner

SEMICONDUCTOR SYSTEM CAPABLE OF STORING DIFFERENT SETTING INFORMATION IN PLURALITY OF SEMICONDUCTOR CHIPS SHARING COMMAND/ADDRESS INFORMATION

CROSS-REFERENCE TO RELATED APPLICATION

This application claims priority under 35 U.S.C. § 119 to Korean Patent Application No. 10-2016-0111757 filed on Aug. 31, 2016, the disclosure of which is herein incorporated by reference in its entirety.

TECHNICAL FIELD

Exemplary embodiments relate to a semiconductor system.

DISCUSSION OF THE RELATED ART

A semiconductor system or a semiconductor package may generally include two or more semiconductor chips. Two or more semiconductor chips included in a single semiconductor system may share command and address (CA) information and a chip select (CS) signal, but characteristics may differ from each other between the two or more semiconductor chips.

FIG. 1 is a diagram illustrating a semiconductor system 100.

Referring to FIG. 1, the semiconductor system 100 may include a first semiconductor chip 110 and a second semiconductor chip 120.

The first and second semiconductor chips 110 and 120 may respectively include CA pad groups CAG1 and CAG2, down data pad groups DDG1 and DDG2, and up data pad groups DUG1 and DUG2. Each pad group may be coupled to outside and include a plurality of pads that are paths through which signals are inputted and outputted.

The first and second semiconductor chips 110 and 120 are controlled by CA information CA and a chip select signal CS which are inputted through the corresponding CA pad groups CAG1 and CAG2 thereof. The CA information CA and the chip select signal CS may include a plurality of command signals and a plurality of address signals. Since the first and second semiconductor chips 110 and 120 share the CA information CA and the chip select signal CS applied thereto, the first and second semiconductor chips 110 and 120 may be controlled to perform the same operation.

Furthermore, in the semiconductor system 100, all of the data pad groups DDG1, DDG2, DUG1 and DUG2 of the first and second semiconductor chips 110 and 120 may not be used. Only some of the data pad groups DDG1, DDG2, DUG1 and DUG2 may be used. For instance, only the down data pad group DDG1 of the first semiconductor chip 110 may be used, and only the up data pad group DDG2 of the second semiconductor chip 120 may be used. In this case, only the data pad groups that are used may be coupled with the outside.

To optimize the operation of the semiconductor system 100, a training operation of setting operation conditions of the semiconductor chips may be performed. The training operation may be, for example, an operation of setting a CA reference voltage at which data windows of CA information are maximized while various CA information patterns are inputted. In this regard, to set a semiconductor chip to use the optimized CA reference voltage detected through the training operation, setting information may need to be stored in the semiconductor chip.

Such setting information is inputted through the CA pad groups CAG1 and CAG2 of each semiconductor chip. Since the respective characteristics of the semiconductor chips differ from each other, the values of setting information to be stored in the respective semiconductor chips may differ from each other. However, as described above, since the first and second semiconductor chips 110 and 120 included in the semiconductor system 100 share the CA information CA and the chip select signal CS, a method of storing the respective CA information CA and the respective chip select signal CS in the first and second semiconductor chips 110 and 120 is needed.

SUMMARY

Various embodiments are directed to a semiconductor system configured such that different setting information may be stored in two or more semiconductor chips that share command and address (CA) information and a chip select signal (CS).

Also, various embodiments are directed to a semiconductor system which appropriately sets an operation mode depending both on an external data channel coupled with each semiconductor chip and on a data pad group used in each semiconductor chip.

In an embodiment, a semiconductor system may include: an external channel including a command/address (CA) channel, and first and second data channels; and first and second semiconductor chips which are coupled in common to the CA channel, coupled to respective different ones of the first and second data channels, and include respective coupling information pads in which different values from each other are inputted. Each of the first and second semiconductor chips may selectively store setting information based on CA information applied to the CA channel and the value inputted to the corresponding coupling information pad.

One of the first and second semiconductor chips may disable an on-die termination function thereof based on the CA information and the value inputted to the corresponding coupling information pad, and the other semiconductor chip may enable an on-die termination function thereof based on the CA information and the value inputted to the corresponding coupling information pad.

A first value may be inputted to the coupling information pad of one of the first and second semiconductor chips, which is coupled to the first data channel, and a second value may be inputted to the coupling information pad of the other semiconductor chip which is coupled to the second data channel.

When a first storage mode is set, one of the first and second semiconductor chips, which receives the first value through the corresponding coupling information pad, may be enabled, and the other semiconductor chip that receives the second value may be disabled. When a second storage mode is set, one of the first and second semiconductor chips, which receives the second value through the corresponding coupling information pad, may be enabled, and the other semiconductor chip that receives the first value may be disabled. The setting information applied to the first and second semiconductor chips through the CA channel may be stored in only an enabled one of the first and second semiconductor chips.

The first semiconductor chip may include: a plurality of first CA pads coupled to the CA channel; and a plurality of first CA buffers, each configured to buffer, using a first CA reference voltage, a signal inputted to a corresponding one of the plurality of first CA pads, and the second semiconductor chip may include: a plurality of second CA pads coupled to the CA channel; and a plurality of second CA buffers, each configured to buffer, using a second CA reference voltage, a signal inputted to a corresponding one of the plurality of second CA pads.

A first CA training operation may be an operation for detecting optimum levels of the first and second CA reference voltages at which valid data windows of the CA information are maximized, and during the first CA training operation, each of the first and second semiconductor chips repeatedly may perform an operation for receiving the setting information through the CA channel, setting a level of a corresponding one of the first and second CA reference voltages, and entering a test mode, and receiving and storing the CA information, outputting the stored CA information to one of the first and second data channels, which is coupled with the corresponding semiconductor chip, and exiting the test mode.

The first and second semiconductor chips may be selectively enabled based on the CA information and the values inputted to the respective coupling information pads, and may respectively store first setting information corresponding to an optimum level of the first CA reference voltage and second setting information corresponding to an optimum level of the second CA reference voltage.

A second CA training operation may be an operation for detecting optimum levels of the first and second CA reference voltages at which valid data windows of the CA information are maximized, and during the second CA training operation, each of the first and second semiconductor chips repeatedly may perform, after entering a test mode, an operation for receiving the setting information through one of the first and second data channels, which is coupled with the corresponding semiconductor chip, and setting a level of a corresponding one of the first and second CA reference voltages, and receiving and storing the CA information, and outputting the stored CA information to one of the first and second data channels, which is coupled with the corresponding semiconductor chip, and then exits the test mode.

The first and second semiconductor chips may be selectively enabled based on the CA information and the values inputted to the respective coupling information pads, and may respectively store first setting information corresponding to an optimum level of the first CA reference voltage and second setting information corresponding to an optimum level of the second CA reference voltage.

The first semiconductor chip may include: a plurality of first down and first up data pads; and a plurality of first data buffers, each configured to buffer, using a first data reference voltage, a signal inputted to a corresponding one of the plurality of first down and first up data pads, and the second semiconductor chip may include: a plurality of second down and second up data pads; and a plurality of second data buffers, each configured to buffer, using a second data reference voltage, a signal inputted to a corresponding one of the plurality of second down and second up data pads, and wherein the plurality of first down data pads may be coupled to the first data channel, and the plurality of second up data pads may be coupled to the second data channel, or the plurality of first down data pads may be coupled to the second data channel, and the plurality of second up data pads may be coupled to the first data channel.

A write training operation may be an operation for detecting optimum levels of the first and second data reference voltages at which valid windows of data to be inputted to the first and second semiconductor chips through the first and second data channels are maximized, and during the write training operation, each of the first and second semiconductor chips repeatedly may perform an operation for receiving the setting information through the CA channel and setting a level of a corresponding one of the first and second data reference voltages, and receiving and storing the data, outputting the stored data to one of the first and second data channels, which is coupled with the corresponding semiconductor chip, and changing an input time of the data or an input time of a data strobe.

The first and second semiconductor chips may be selectively enabled based on the CA information and the values inputted to the respective coupling information pads, and may respectively store first setting information corresponding to an optimum level of the first data reference voltage and second setting information corresponding to an optimum level of the second data reference voltage.

The first and second semiconductor chips may respectively store first and second invert information, selectively invert data to be outputted to the plurality of first and second data pads in response to the first invert information, and selectively invert data to be outputted to the plurality of first and second data pads in response to the second invert information.

When the plurality of first down data pads are coupled to the first data channel and the plurality of second up data pads are coupled to the second data channel, the first and second semiconductor chips may store invert information inputted along with a first setting command as the first invert information, and store the invert information inputted along with a second setting command as the second invert information, and when the plurality of first down data pads are coupled to the second data channel and the plurality of second up data pads are coupled to the first data channel, the first and second semiconductor chips may store the invert information inputted along with the first setting command as the second invert information, and store the invert information inputted along with the second setting command as the second invert information.

In an embodiment, a semiconductor system may include: an external channel including a command/address (CA) channel, and first and second data channels; and first and second semiconductor chips which are coupled in common to the CA channel, coupled to respective different ones of the first and second data channels, and include respective coupling information pads in which different values from each other are inputted, wherein each of the first and second semiconductor chips includes a plurality of mode register sets, and selectively stores, in one of the mode register sets, setting information based on CA information applied to the CA channel and the value inputted to the corresponding coupling information pad.

The plurality of mode register sets may include: an on-die termination mode register set, a CA reference voltage mode register set, a data reference voltage mode register set, a reference voltage setting mode register set, a first output data invert mode register set, and a second output data invert mode register set.

When identical setting information is stored in the on-die termination mode register sets of the first and second semiconductor chips, depending on the values inputted to the coupling information pads of the first and second semiconductor chips, an on-die termination function of one of the first and second semiconductor chips may be enabled, and the on-die termination function of the other semiconductor chip may be disabled.

The first semiconductor chip may include: a plurality of CA pads coupled to the CA channel; and a plurality of first CA buffers, each configured to buffer, using a first CA reference voltage, a signal inputted to a corresponding one of the plurality of first CA pads. A level of the first CA reference voltage may be controlled depending on a value stored in the CA reference voltage mode register set of the first semiconductor chip. The second semiconductor chip may include: a plurality of second CA pads coupled to the CA channel; and a plurality of second CA buffers, each configured to buffer, using a second CA reference voltage, a signal inputted to a corresponding one of the plurality of second CA pads. A level of the second CA reference voltage is controlled depending on a value stored in the CA reference voltage mode register set of the second semiconductor chip.

A first CA training operation may be an operation for detecting optimum levels of the first and second CA reference voltages at which valid data windows of the CA information are maximized, and during the first CA training operation, each of the first and second semiconductor chips may repeatedly perform an operation for receiving the setting information through the CA channel and storing the setting formation in the CA reference voltage mode register set, and entering a test mode, and receiving and storing the CA information, outputting the stored CA information to one of the first and second data channels, which is coupled with the corresponding semiconductor chip, and exiting the test mode.

Each of the first and second semiconductor chips may store a first setting value in the reference voltage setting mode register set, and the first semiconductor chip that is selected based on the first setting value and the value inputted to the corresponding coupling information pad may store first setting information in the corresponding CA reference voltage mode register set, and Each of the first and second semiconductor chips may store a second setting value in the reference voltage setting mode register set, and the second semiconductor chip that is selected based on the second setting value and the value inputted to the corresponding coupling information pad may store second setting information in the corresponding CA reference voltage mode register set.

A second CA training operation may be an operation for detecting optimum levels of the first and second CA reference voltages at which valid data windows of the CA information are maximized, and during the second CA training operation, each of the first and second semiconductor chips may repeatedly perform, after entering a test mode, an operation for receiving the setting information through one of the first and second data channels, which is coupled with the corresponding semiconductor chip, and storing the setting information in the CA reference voltage mode register set, and receiving and storing the CA information, and outputting the stored CA information to one of the first and second data channels, which is coupled with the corresponding semiconductor chip, and exits the test mode.

Each of the first and second semiconductor chips may store a first setting value in the reference voltage setting mode register set, and the first semiconductor chip that is selected based on the first setting value and the value inputted to the corresponding coupling information pad may store first setting information in the corresponding CA reference voltage mode register set, and each of the first and second semiconductor chips may store a second setting value in the reference voltage setting mode register set, and the second semiconductor chip that is selected based on the second setting value and the value inputted to the corresponding coupling information pad may store second setting information in the corresponding CA reference voltage mode register set.

The first semiconductor chip may include: a plurality of first down and first up data pads; and a plurality of first data buffers, each configured to buffer, using a first data reference voltage, a signal inputted to a corresponding one of the plurality of first down and first up data pads, and the second semiconductor chip may include: a plurality of second down and second up data pads; and a plurality of second data buffers, each configured to buffer, using a second data reference voltage, a signal inputted to a corresponding one of the plurality of second down and second up data pads, and the plurality of first down data pads may be coupled to the first data channel, and the plurality of second up data pads may be coupled to the second data channel, or the plurality of first down data pads may be coupled to the second data channel, and the plurality of second up data pads may be coupled to the first data channel.

A write training operation may be an operation for detecting optimum levels of the first and second data reference voltages at which valid windows of data to be inputted to the first and second semiconductor chips through the first and second data channels are maximized, and during the write training operation, each of the first and second semiconductor chips may repeatedly perform an operation of receiving the setting information through the CA channel and storing the setting information in the data reference voltage mode register set, and entering a test mode, and receiving and storing the data, outputting the stored data to one of the first and second data channels, which is coupled with the corresponding semiconductor chip, and changing an input time of the data or an input time of a data strobe.

Each of the first and second semiconductor chips may store a first setting value in the reference voltage setting mode register set, and the first semiconductor chip that is selected based on the first setting value and the value inputted to the corresponding coupling information pad may store first setting information in the corresponding data reference voltage mode register set, and each of the first and second semiconductor chips may store a second setting value in the reference voltage setting mode register set, and the second semiconductor chip that is selected based on the second setting value and the value inputted to the corresponding coupling information pad may store second setting information in the corresponding data reference voltage mode register set.

The first and second semiconductor chips may store invert information in the first and second output data invert mode register sets, selectively invert data to be outputted to the plurality of first and second down data pads depending on a value stored in the first output data invert mode register set, and selectively invert data to be outputted to the first and second up data pads which are inverted depending on a value stored in the second output data invert mode register set.

When the plurality of first down data pads are coupled to the first data channel and the plurality of second up data pads are coupled to the second data channel, the first and second semiconductor chips may store the invert information inputted along with a first setting command in the first output data invert mode register set, and store the invert information inputted along with a second setting command in the second output data invert mode register set, and when the plurality of first down data pads are coupled to the second data channel and the plurality of second up data pads are coupled to the first data channel, the first and second semiconductor chips may store the invert information inputted along with the first setting command in the second output data invert mode register set, and store the invert information inputted along with the second setting command in the first output data invert mode register set.

In an embodiment, a semiconductor system may include: an external channel including a command/address (CA) channel, and first and second data channels; and first and second semiconductor chips which are coupled in common to the CA channel and coupled to respective different ones of the first and second data channels, and each of which includes a storage unit. In one of the first and second semiconductor chips, which is coupled to the first data channel, coupling information having a first value may be stored in the storage unit, and, in the other semiconductor chip that is coupled to the second data channel, coupling information having a second value may be stored in the storage unit, and each of the first and second semiconductor chips may selectively store setting information based on CA information applied to the CA channel and the coupling information stored in the corresponding storage unit.

One of the first and second semiconductor chips may disable an on-die termination function thereof based on the CA information and the coupling information stored in the corresponding storage unit, and the other semiconductor chip may enable an on-die termination function thereof based on the CA information and the coupling information stored in the corresponding storage unit.

When a first storage mode is set, one of the first and second semiconductor chips, which stores the first value as the coupling information in the corresponding storage unit, may be enabled, and the other semiconductor chip which stores the second value may be disabled. When a second storage mode is set, one of the first and second semiconductor chips, which stores the second value as the coupling information in the corresponding storage unit, may be enabled, and the other semiconductor chip which stores the first value may be disabled. The setting information applied to the first and second semiconductor chips through the CA channel may be stored in only an enabled one of the first and second semiconductor chips.

DETAILED DESCRIPTION

Figure 1:
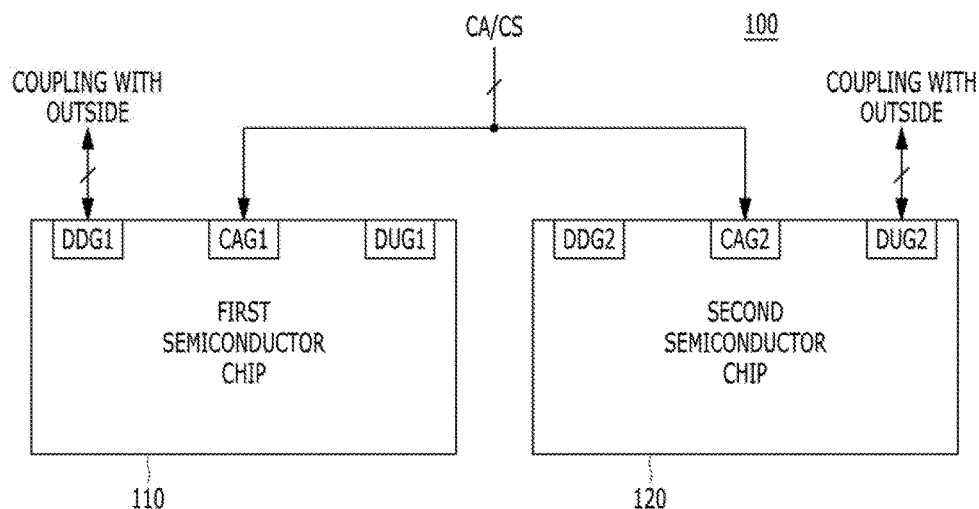
FIG. 1 is a diagram illustrating a semiconductor system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
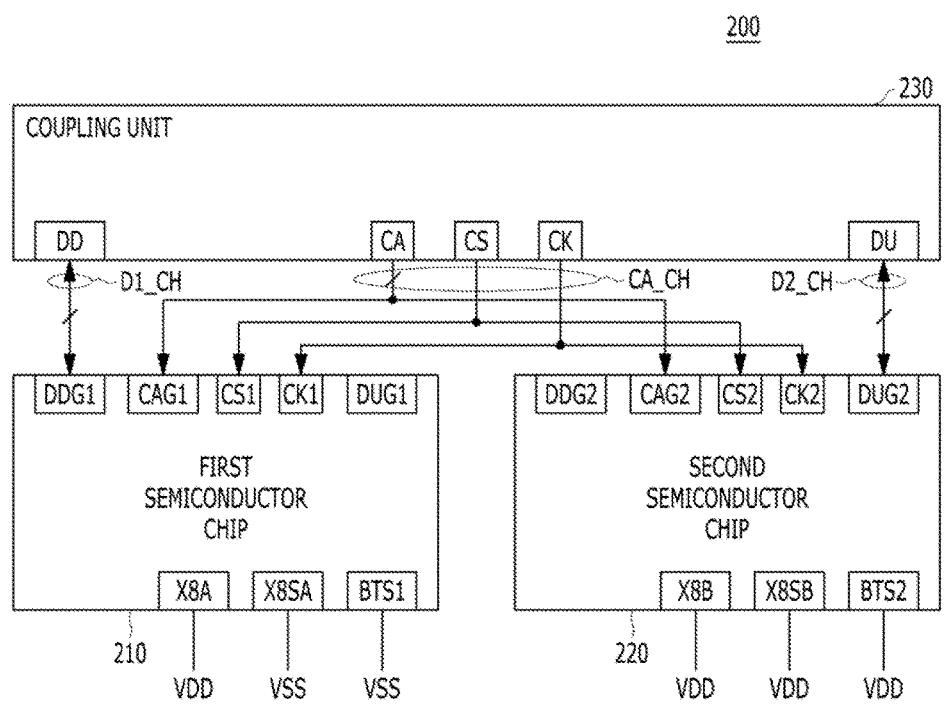
FIG. 2 is a diagram illustrating a semiconductor system in accordance with an embodiment of the present invention.

FIG. 2 is a diagram illustrating a semiconductor system 200 in accordance with an embodiment of the present invention.

Referring to FIG. 2, the semiconductor system 200 may include a first semiconductor chip 210, a second semiconductor system 220, and a coupling unit 230.

The first and second semiconductor chips 210 and 220 may respectively include CA pad groups CAG1 and CAG2, clock pads CK1 and CK2, chip select pads CS1 and CS2, down data pad groups DDG1 and DDG2, up data pad groups DUG1 and DUG2, coupling information pads BTS1 and BTS2, X8 pads X8A and X8B, and X8S pads X8SA and X8SB. The pad group may refer to a group including one or more pads.

Hereafter, a signal inputted through each of the pads X8A, X8SA, BTS1, CS1, CK1 and DQS may have the same reference numeral as that of the corresponding pad.

Figure 3:
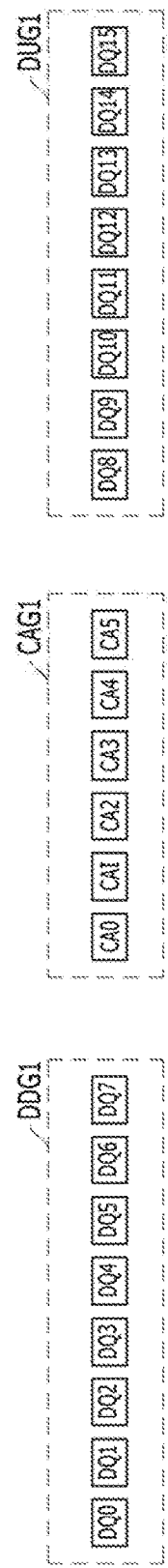
FIG. 3 is a diagram illustrating pad groups of a first semiconductor chip of FIG. 2.

FIG. 3 is a diagram illustrating the pad groups CAG1, DDG1 and DUG1 of the first semiconductor chip 210 of FIG. 2.

Referring to FIG. 3, the CA pad group CAG1 may include a plurality of CA pads CA0 to CA5, the down data pad group DDG1 may include a plurality of down data pads DQ0 to DQ7, and the up data pad group DUG1 may include a plurality of up data pads DQ8 to DQ15. The pad groups CAG2, DDG2 and DUG2 of the second semiconductor chip 220 may have the same configurations as those of FIG. 3. The number of pads included in each pad group may be changed depending on design.

The coupling unit 230 may have a configuration for coupling the first and second semiconductor chips 210 and 220 with outside of the semiconductor system 200. The coupling unit 230 includes a CA coupling unit CA, a CS coupling unit CS, a CK coupling unit CK, a down data coupling unit DD, and an up data coupling unit DU. Each of the CS coupling unit CS and the CK coupling unit CK may include a single ball which is coupled to the outside of the semiconductor system 200 to transmit a chip select signal or a clock signal. Each of the CA coupling unit CA, the down data coupling unit DD and the up data coupling unit DU may include a plurality of balls which are coupled to the outside of the semiconductor system 200 to transmit a plurality of CA signals or a plurality of data signals.

The outside of the semiconductor 200 and the pads CAG1, CAG2, CS1, CS2, CK1 and CK2 of the first and second semiconductor chips 210 and 220 are coupled to each other through the CA coupling unit CA, the CS coupling unit CS and the CK coupling unit CK of the coupling unit 230, respectively. A path for transmitting CA Information including the CA signals, the chip select signal and the clock signal between the outside of the semiconductor system 200 and the first and second semiconductor chips 210 and 220 may be designated as a CA channel CA_CH. The outside of the semiconductor system 200 and the down data pad group DDG1 of the first semiconductor chip 210 are coupled to each other through the down data coupling unit DD of the coupling unit 230. A path for transmitting data between the outside of the semiconductor system 200 and the first semiconductor chip 210 may be designated as a first data channel D1_CH. The outside of the semiconductor system 200 and the up data pad group DUG2 of the second semiconductor chip 220 are coupled to each other through the up data coupling unit DU of the coupling unit 230. A path for transmitting data between the outside of the semiconductor system 200 and the second semiconductor chip 220 may be designated as a second data channel D2_CH.

Each of the coupling information pads BTS1 and BTS2 may be a pad for setting which one of the first and second data channels D1_CH and D2_CH is a data channel through which a corresponding one of the first and second semiconductor chips 210 and 220 exchanges data with the outside of the semiconductor system 200. When the semiconductor chip exchanges data with the outside of the semiconductor system 200 through the first data channel D1_CH, a ground voltage VSS, that is, a low level voltage, may be applied to the coupling information pad BTS1 or BTS2. When the semiconductor chip exchanges data with the outside of the semiconductor system 200 through the second data channel D2_CH, a power supply voltage VDD, that is, a high level voltage, may be applied to the coupling information pad BTS1 or BTS2. Therefore, in the semiconductor system 200 of FIG. 2, the ground voltage VSS may be applied to the coupling information pad BTS1, and the power supply voltage VDD may be applied to the coupling information pad BTS2.

The X8 pads X8A and X8B may be respectively pads for setting read latency of the first and second semiconductor chips 210 and 220. When the ground voltage VSS, that is, a low level voltage, is applied to a X8 pad X8A or X8B, the semiconductor chip may operate with first read latency. When the power supply voltage VDD, that is, a high level voltage, is applied to a X8 pad X8A or X8B, the semiconductor chip may operate with second read latency which is longer than the first read latency. Therefore, in the semiconductor system 200 of FIG. 2, both the first and second semiconductor chips 210 and 220 may operate with the second read latency. For reference, the latency may refer to a time interval from a time at which a read command is applied to the semiconductor system 200 through the CA channel CA_CH to a time at which data begins to be outputted through the first and second data channels D1_CH and D2_CH.

Each of the X8S pads X8SA and X8SB may be a pad for setting which one of the down data pad groups DDG1 and DDG2 and the up data pad groups DUG1 and DUG2 is a pad group through which a corresponding one of the first and second semiconductor chips 210 and 220, inputs and outputs data. When the semiconductor chip inputs and outputs data through the down data pad group DDG1 or DDG2, the ground voltage VSS, that is, a low level voltage, may be applied to the X8S pad X8SA or X8SB. When the semiconductor chip inputs and outputs data through the up data pad group DUG1 or DUG2, the power supply voltage VDD, that is, a high level voltage, may be applied to the X8S pad X8SA or X8SB. Therefore, in the semiconductor system 200 of FIG. 2, the ground voltage VSS may be applied to the X8S pad X8SA, and the power supply voltage VDD may be applied to the X8S pad X8SB.

Figure 4:
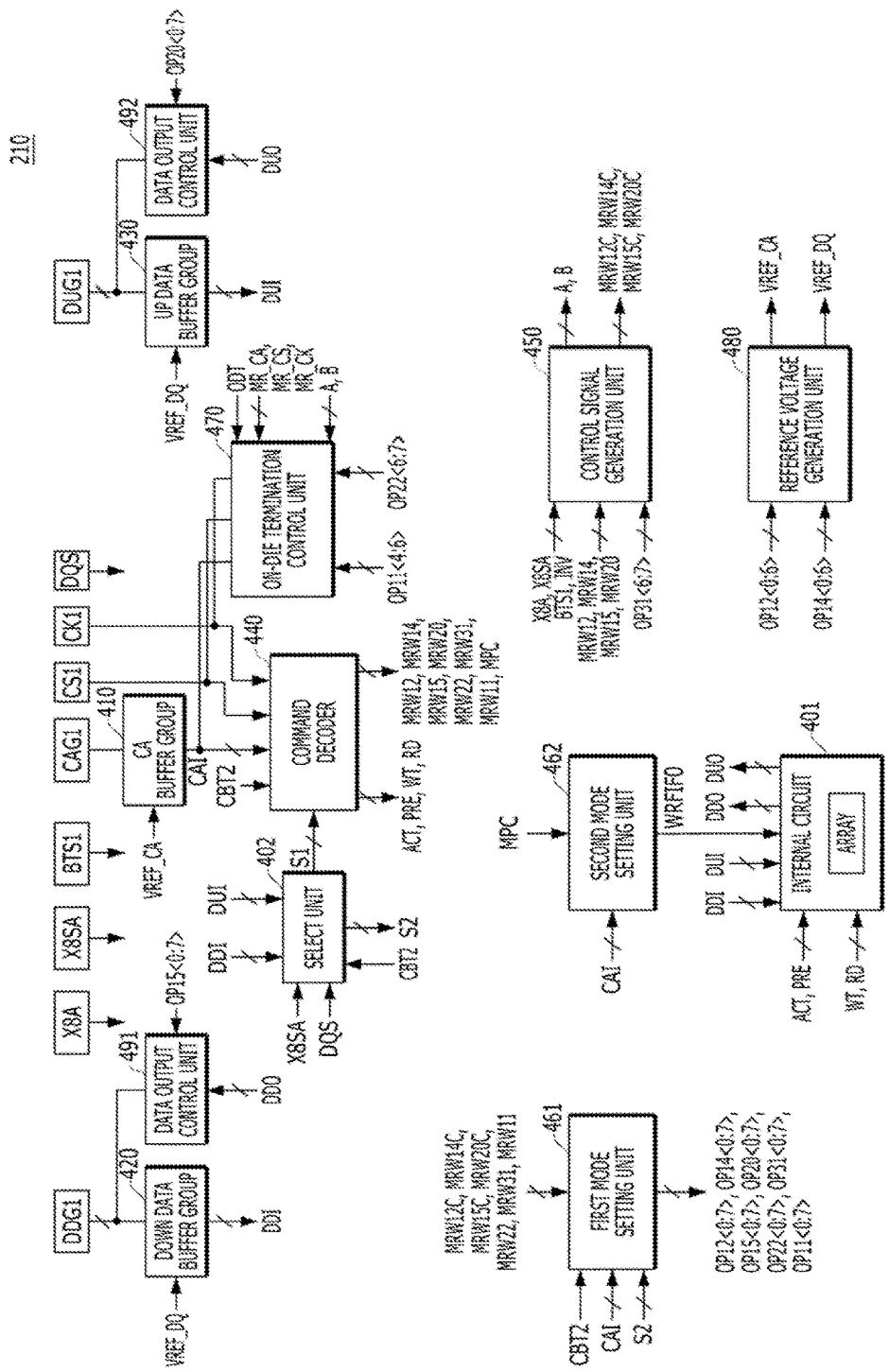
FIG. 4 is a diagram illustrating the first semiconductor chip of FIG. 2 in accordance with an embodiment of the present invention.

FIG. 4 is a diagram illustrating the first semiconductor chip 210 of FIG. 2 in accordance with an embodiment of the present invention.

Referring to FIG. 4, the first semiconductor chip 210 may include a CA buffer group 410, a down data buffer group 420, an up data buffer group 430, a command decoder 440, a control signal generation unit 450, a first mode setting unit 461, a second mode setting unit 462, an on-die termination control unit 470, a reference voltage generation unit 480, data output control units 491 and 492, and an internal circuit 401. The first semiconductor chip 210 may receive a strobe signal DQS through a strobe signal pad DQS. The first semiconductor chip 210 may include a select unit 402.

Hereinafter, data buffered in and outputted from the down and up data buffer groups 420 and 430 may respectively be referred to as input data DDI and DUI, and data outputted through data output control units 491 and 492 may respectively be referred to as output data DDO and DUO. Signals buffered and outputted through the CA buffer group 410 may refer to internal CA signals CAI.

Figure 5:
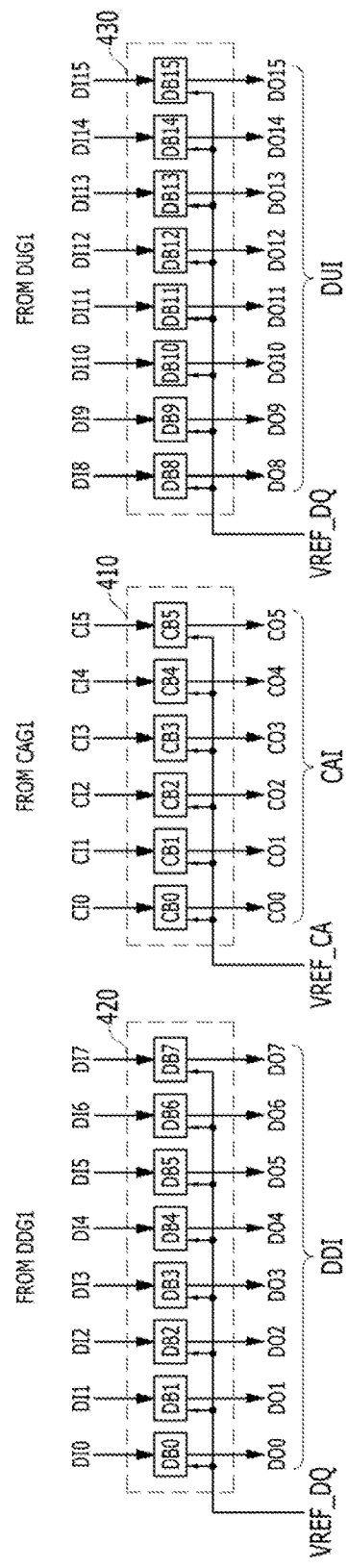
FIG. 5 is a diagram illustrating buffer groups of the first semiconductor chip shown in FIG. 4.

FIG. 5 is a diagram illustrating the buffer groups 410 to 430 of the first semiconductor chip 210 shown in FIG. 4.

Referring to FIG. 5, the CA buffer group 410 may include a plurality of CA buffers CB0 to CB5, the down data buffer group 420 may include a plurality of down data buffers DB0 to DB7, and the up data buffer group 430 may include a plurality of up data buffers DB8 to DB15.

The CA buffers CB0 to CB5 may buffer a plurality of CA signals CI0 to CI5 and output a plurality of signals CO0 to CO5, respectively. In more detail, when each of the CA signals CI0 to CI5 is lower than a CA reference voltage VREF_CA, the corresponding one of the CA buffers CB0 to CBS5 may output a low level voltage, and when it is higher than or equal to the CA reference voltage VREF_CA, the corresponding CA buffer may output a high level voltage.

The data buffers DB0 to DB15 may buffer data DI0 to DI15 and output data DO0 to DO15. In more detail, when each of the data DI0 to DI15 is lower than a data reference voltage VREF_DQ, the corresponding one of the data buffers DB0 to DB15 may output a low level voltage, and when it is higher than or equal to the data reference voltage VREF_DQ, the corresponding data buffer may output a high level voltage. In this regard, the level of each of the CA reference voltage VREF_CA and the data reference voltage VREF_DQ may be controlled depending on settings of the first mode setting unit 461, For reference, data inputted to the down data pad group DDG1 of FIG. 4 may correspond to the data DI0 to DI17 of FIG. 5, the input data DDI of FIG. 4 may correspond to the data DO0 to DO07 of FIG. 5, data inputted to the up data pad group DUG1 of FIG. 4 may correspond to the data DI8 to DI15 of FIG. 5, the input data DUI of FIG. 4 may correspond to the data DO08 to DO15 of FIG. 5, CA signals inputted to the CA pad group CAG1 of FIG. 4 may correspond to the CA signals CI0 to CI5 of FIG. 5, and the Internal CA signals CAI of FIG. 4 may correspond to the signals CO0 to CO5 of FIG. 5.

The command decoder 440 may generate, when a chip select signal inputted through the CS pad CS1 is enabled, internal commands ACT, PRE, WT, RD, MRW11, MRW12, MRW14, MRW15, MRW20, MRW22, MRW31 and MPC in response to the internal CA signals CAI inputted from the CA buffer group 410 through the CA pad group CAG1 and a clock signal inputted through the CK pad CK1. An active command ACT may be a command for activating word lines (not shown in FIG. 4) included in a cell array ARRAY of the Internal circuit 401. A precharge command PRE may be a command for precharging an activated word line. A write command WT may be a command for writing data in the cell array ARRAY. A read command RD may be a command for reading data from the cell array ARRAY.

When, among the internal commands, commands MRW11, MRW12, MRW14, MRW15, MRW20, MRW22, MRW31 and MPC for mode setting hereafter, referred to as "setting commands" are enabled, the internal CA signals CAI may be stored in the first or second mode setting unit 461 or 462, and an operating mode may be set according to the first or second mode setting unit 461 or 462.

When any one of the setting commands and control signals MRW12C, MRW14C, MRW15C, MRW20C, MRW11, MRW22, and MRW31 is enabled, the first mode setting unit 461 may enter a settable state, and store the internal CA signals CAI inputted in the settable state and thus set the operating mode.

Figure 6:
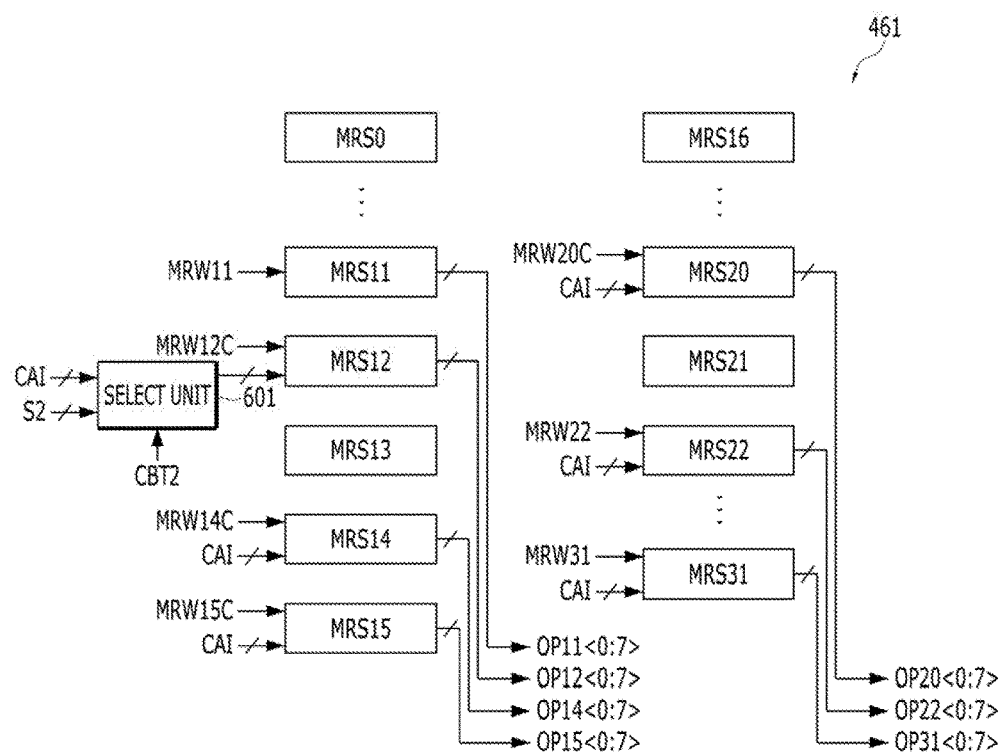
FIG. 6 is a diagram illustrating a first mode setting unit of the first semiconductor chip shown in FIG. 4.

FIG. 6 is a diagram illustrating the first mode setting unit 461 of the first semiconductor chip 210 shown in FIG. 4.

Referring to FIG. 6, the first mode setting unit 461 may include a plurality of mode register sets MRS0 to MRS31, and a selection unit 601. The mode register sets MRS0 to MRS31 may be provided to set certain operating modes of the semiconductor chip. Depending on a value stored in each of the mode register sets MRS0 to MRS31, an operating mode corresponding to the associated one of the mode register sets MRS0 to MRS31 may be set. Each of the mode register sets MRS11, MRS12, MRS14, MRS15, MRS20, MRS22 and MRS31 may enter a settable state when a corresponding setting command or control signal MRW12C, MRW14C, MRW15C, MRW20C, MRW11, MRW22, or MRW31 is enabled. For example, when the control signal MRW14C is enabled, the mode register set MRS14 enters a settable state, and thereafter the Internal CA signals CAI inputted from the CA buffer group 410 may be stored in the mode register set MRS14 as setting information.

In the case of a second CA training operation, the command decoder 440 and the first mode setting unit 461 may operate as follows.

First, when the second CA training operation is set, a training mode signal CBT2 may be enabled.

When the training mode signal CBT2 is enabled, and a signal inputted to the X8S pad X8SA is a low level signal, the select unit 402 may output, along with enabling the strobe signal DQS, the input data DDI inputted through the down data pad group DDG1 to the command decoder 440, as first signals S1, and may output, without enabling the strobe signal DQS, the input data DDI inputted through the down data pad group DDG1 to the first mode setting unit 461, as second signals S2. When the training mode signal CBT2 is enabled, and a signal inputted to the X8S pad X8SA is a high level signal, the select unit 402 may output, along with enabling the strobe signal DQS, the input data DUI inputted through the up data pad group DUG1 to the command decoder 440, as the first signals S1, and may output, without enabling the strobe signal DQS, the input data DUI inputted through the up data pad group DUG1 to the first mode setting unit 461, as the second signals S2.

When the training mode signal CBT2 is enabled, the command decoder 440 may enable a setting command MRW12 in response to the first signals S1 outputted from the select unit 402.

When the training mode signal CBT2 is disabled, the select unit 601 of the first mode setting unit 461 may select and output the internal CA signals CAI to the mode register set MRS12. When the training mode signal CBT2 is enabled, the select unit 601 may select and output the second signals S2 outputted from the select unit 402 to the mode register set MRS12. Therefore, when the training mode signal CBT2 is disabled, and the control signal MRW12C is enabled, the mode register set MRS12 may store the internal CA signals CAI as the setting information. When the training mode signal CBT2 is enabled, if the control signal MRW12C is enabled, the mode register set MRS12 may store, as the setting information, the second signals S2 outputted from the select unit 402, that is, the input data DDI or DUI inputted to the down data pads DQ0 to DQ7 or the up data pads DQ8 to DQ15.

Figure 7:
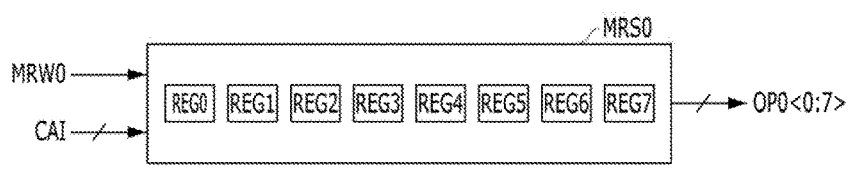
FIG. 7 is a diagram illustrating a mode register set of FIG. 6.

FIG. 7 is a diagram illustrating the mode register set MRS0 of FIG. 6.

Referring to FIG. 7, the mode register set MRS0 may include a plurality of registers REG0 to REG7 for storing setting information. When the setting command MRW0 is enabled, the mode register set MRS0 may enter a state in which setting information can be stored in each of the registers REG0 to REG7. Each bit stored in the respective registers REG0 to REG7 of the mode register set MRS0 may be outputted as setting information OP0<0:7> to the outside of the mode register set MRS0. The configuration and operation of the other mode register sets MRS1 to MRS31 may be the same as those of the mode register set MRS0.

Each of the mode register sets MRS11, MRS12, MRS14, MRS15, MRS20, MRS22 and MRS31 may output setting information OP11<0:7>, OP12<0:7>, OP14<0:7>, OP15<0:7>, OP20<0:7>, OP22<0:7> and OP31<0:7> after the setting has been completed. Hereinbelow, among the setting information outputted from the mode register sets MRS11, MRS12, MRS14, MRS15, MRS20, MRS22 and MRS31, only some of the values needed to describe the operation of the embodiment will be illustrated and described.

The mode register set MRS12 may store and output information for setting a level of the CA reference voltage VREF_CA. The level of the CA reference voltage VREF_CA may be adjusted depending on a value of the setting information OP12<0:6>. As the value of the setting information OP12<0:6> increases, the level of the CA reference voltage VREF_CA may increase. As the value of the setting information OP12<0:6> decreases, the level of the CA reference voltage VREF_CA may decrease. The value of the setting information OP12<0:6> and the level of the CA reference voltage VREF_CA may correspond oneto-one to each other. The mode register set MRS12 may be a CA reference voltage mode register set for setting a mode of the CA reference voltage.

The mode register set MRS14 may store and output information for setting a level of the data reference voltage VREF_DQ. The level of the data reference voltage VREF_DQ may be adjusted depending on a value of the setting information OP14<0:6>. As the value of the setting information OP14<0:6> increases, the level of the data reference voltage VREF_DQ may increase. When the value of the setting Information OP14<0:6> decreases, the level of the data reference voltage VREF_DQ may decrease. The value of the setting information OP14<0:6> and the level of the data reference voltage VREF_DQ may correspond one-to-one to each other. The mode register set MRS14 may be a data reference voltage mode register set for setting a mode of the data reference voltage.

The mode register set MRS15 may output information for setting an invert mode of data to be outputted to the down data pads DQ0 to DQ7. Bits of the setting information OP15<0:7> outputted from the mode register set MRS15 may respectively correspond to the down data pads DQ0 to DQ7. Data to be outputted, among the down data pads DQ0 to DQ7, to a down data pad corresponding to a bit of '0' may be outputted without being inverted, and data to be outputted to a down data pad corresponding to a bit of '1' may be inverted and outputted. The mode register set MRS15 may be a first output data invert mode register set for setting invert modes of the down data pads DQ0 to DQ7.

The mode register set MRS20 may output information for setting an invert mode of data to be outputted to the up data pads DQ8 to DQ15. Bits of the setting information OP20<0:7> outputted from the mode register set MRS20 may respectively correspond to the up data pads DQ8 to DQ15. Data to be outputted, among the up data pads DQ8 to DQ15, to a down data pad corresponding to a bit of '0' may be outputted without being inverted, and data to be outputted to a down data pad corresponding to a bit of '1' may be inverted and outputted. The mode register set MRS20 may be a second output data invert mode register set for setting invert modes of the up data pads DQ8 to DQ15.

TABLE 1

| Value of setting information | Whether inverted | Original output data | Final output data |
| --- | --- | --- | --- |
| OP15<0> | 1 | Inverted | DQ0 = 0 | DQ0 = 1 |
| OP15<1> | 0 | Not inverted | DQ1 = 0 | DQ1 = 0 |
| OP15<2> | 1 | Inverted | DQ2 = 0 | DQ2 = 1 |
| OP15<3> | 1 | Inverted | DQ3 = 0 | DQ3 = 1 |
| OP15<4> | 0 | Not inverted | DQ4 = 0 | DQ4 = 0 |
| OP15<5> | 0 | Not inverted | DQ5 = 0 | DQ5 = 0 |
| OP15<6> | 1 | Inverted | DQ6 = 0 | DQ6 = 1 |
| OP15<7> | 0 | Not inverted | DQ7 = 0 | DQ7 = 0 |
| OP20<0> | 0 | Not inverted | DQ8 = 0 | DQ8 = 0 |
| OP20<1> | 1 | Inverted | DQ9 = 0 | DQ9 = 1 |
| OP20<2> | 0 | Not inverted | DQ10 = 0 | DQ10 = 0 |
| OP20<3> | 0 | Not inverted | DQ11 = 0 | DQ11 = 0 |
| OP20<4> | 1 | Inverted | DQ12 = 0 | DQ12 = 1 |
| OP20<5> | 1 | Inverted | DQ13 = 0 | DQ13 = 1 |
| OP20<6> | 0 | Not inverted | DQ14 = 0 | DQ14 = 0 |
| OP20<7> | 1 | Inverted | DQ15 = 0 | DQ15 = 1 |

[Table 1] Illustrates changes in final output data outputted through the data pads DQ0 to DQ15, depending on the values of the setting information OP15<0:7> and OP20<0:7> when all original output data are '0'.

The mode register sets MRS11 and MRS22 may store and output information for setting an on-die termination function. The on-die termination function may be a function of setting an impedance value of an output pad. Among the setting information OP11<0:7>, the setting information OP11<4:6> may be information for setting a termination resistance value of a pad of which the on-die termination function is enabled. The value of the setting information OP11<4:6> and the termination resistance value may correspond one-to-one to each other.

Among the setting information OP22<0:7>, the setting information OP22<3> may be information for setting a termination function of the CK pad CK1, the setting information OP22<4> may be information for setting a termination function of the CS pad CS1, and the setting information OP22<5> may be information for setting a termination function of the CA pad group CAG1. The termination function of the CK pad CK1 may be disabled when the value of the setting information OP22<3> is '0', and may be enabled when the value of the setting information OP22<3> is '1'. The termination function of the CS pad CS1 may be disabled when the value of the setting information OP22<4> is '0', and may be enabled when the value of the setting information OP22<4> is '1'. The termination function of the CA pad group CAG1 may be disabled when the value of the setting information OP22<5> is '0', and may be enabled when the value of the setting information OP22<5> is '1'.

The setting information OP22<6> may be setting information for integrally controlling the termination functions of the CK pad CK1, the CS pad CS1 and the CA pad group CAG1 in the semiconductor chip in which a high level voltage is applied to the X8 pad X8A and a low level voltage is applied to the coupling information pad BTS1. When the value of the setting information OP22<6> is '0', the termination functions of the CK pad CK1, the CS pad CS1 and the CA pad group CAG1 may be controlled by the value of the setting information OP22<3:5> in the semiconductor chip in which the X8 pad X8A is set to a high level and the coupling information pad BTS1 is set to a low level. When the value of the setting information OP22<6> is '1', all of the termination functions of the CK pad CK1, the CS pad CS1 and the CA pad group CAG1 may be disabled.

The setting information OP22<7> may be setting information for integrally controlling the termination functions of the CK pad CK1, the CS pad CS1 and the CA pad group CAG1 in the semiconductor chip in which a high level voltage is applied to the X8 pad X8A and a high level voltage is applied to the coupling information pad BTS1. When the value of the setting information OP22<7> is '0', the termination functions of the CK pad CK1, the CS pad CS1 and the CA pad group CAG1 may be controlled by the value of the setting information OP22<3:5> in the semiconductor chip in which the X8 pad X8A is set to a high level and the coupling information pad BTS1 is set to a high level. When the value of the setting information OP22<1> is '1', all of the termination functions of the CK pad CK1, the CS pad CS1 and the CA pad group CAG1 may be disabled.

The mode register sets MRS11 and MRS22 may be on-die termination mode register sets for setting the on-die termination function.

The mode register set MRS31 may store and output information for setting a function of selecting a semiconductor chip to set levels of reference voltages VREF_CA and VREF_DQ. The setting information OP31<6> may be setting information for controlling the function of setting the levels of the reference voltages VREF_CA and VREF_DQ In the semiconductor chip in which a high level voltage is applied to the X8 pad X8A and a low level voltage is applied to the coupling information pad BTS1. When the value of the setting information OP31<6> is '0', in the semiconductor chip in which the X8 pad X8A is set to a high level and coupling information pad BTS1 Is set to a low level, the function of setting the levels of the reference voltage VREF_CA and VREF_DQ is enabled so that setting information therefor may be inputted and stored, and when the value of the setting information OP31<6> is '1', the function is disabled so that even if setting information therefor is inputted, it is not stored.

That is, when the value of the setting information OP31<6> is '0', the semiconductor chip in which the coupling information pad BTS1 is set to a low level may set the level of the CA reference voltage VREF_CA or the data reference voltage VREF_DQ depending on the setting command MRW12 or MRW14. However, when the value of the setting information OP31<6> is '1', the semiconductor chip in which the X8 pad X8A is set to a high level and the coupling information pad BTS1 is set to a low level may not set the level of the CA reference voltage VREF_CA or the data reference voltage VREF_DQ, that is, inputted setting information may not be stored in the mode register set MRS12 or MRS14, even when the setting command MRW12 or MRW14 is enabled.

The setting information OP31<7> may be setting information for controlling a function of setting the levels of the reference voltages VREF_CA and VREF_DQ in the semiconductor chip in which a high level voltage is applied to the coupling information pad BTS1. When the value of the setting information OP31<7> is '0', in the semiconductor chip in which the coupling information pad BTS1 is set to a high level, the function of setting the levels of the reference voltage VREF_CA and VREF_DQ is enabled so that setting information therefor may be inputted and stored, and when the value of the setting information OP31<7> is '1', the function is disabled so that even if setting Information therefor is inputted, it is not stored.

That is, when the value of the setting information OP31<7> is '0', the semiconductor chip in which the X8 pad X8A is set to a high level and the coupling information pad BTS1 is set to a high level may set the level of the CA reference voltage VREF_CA or the data reference voltage VREF_DQ depending on the setting commands MRW12 or MRW14. However, when the value of the setting information OP31<7> is '1', the semiconductor chip in which the X8 pad X8A is set to a high level and the coupling information pad BTS1 is set to a high level may not set the level of the CA reference voltage VREF_CA or the data reference voltage VREF_DQ, that is, inputted setting information may not be stored in the mode register set MRS12 or MRS14, even when the setting command MRW12 or MRW14 is enabled.

The mode register set MRS31 may be a reference voltage setting mode register set for setting a function of setting a reference voltage setting mode.

When the setting command MPC is enabled, the second mode setting unit 462 enters a settable state so that the internal CA signals CAI may be stored in the second mode setting unit 462 as setting information. The second mode setting unit 462 may set, using the setting information, an operation mode hereafter, referred to as a 'WR FIFO mode', of writing the internal CA signals CAI or the input data DDI and DUI in a portion of the internal circuit 401 except for the cell array ARRAY. The second mode setting unit 462 may enable a WR FIFO mode signal WRFIFO when the WR FIFO mode is set, and may disable the WR FIFO mode signal WRFIFO when the WR FIFO mode is not set. The internal circuit 401 may write the input data DDI and DUI in the cell array ARRAY when the WR FIFO mode signal WRFIFO is disabled, and may write the input data DDI and DUI in a peripheral circuit (not shown in FIG. 4) for the cell array ARRAY.

In general, since writing or reading data in or from the peripheral circuit is faster than writing or reading data in or from the cell array ARRAY, when a test operation that is not related to the cell array ARRAY is performed, the time it takes to perform the test operation may be reduced by using the WR FIFO mode.

The control signal generation unit 450 may generate a plurality of control signals A, B, C, MRW12C, MRW14C, MRW15C and MRW20C in response to the signals BTS1, X8A and X8SA inputted through the coupling information pad BTS1, the X8 pad X8A and the X8S pad X8SA, the setting commands MRW12, MRW14, MRW15 and MRW20 outputted from the command decoder 440, the setting information OP31<6:7>, and a coupling signal INV.

Figure 8:
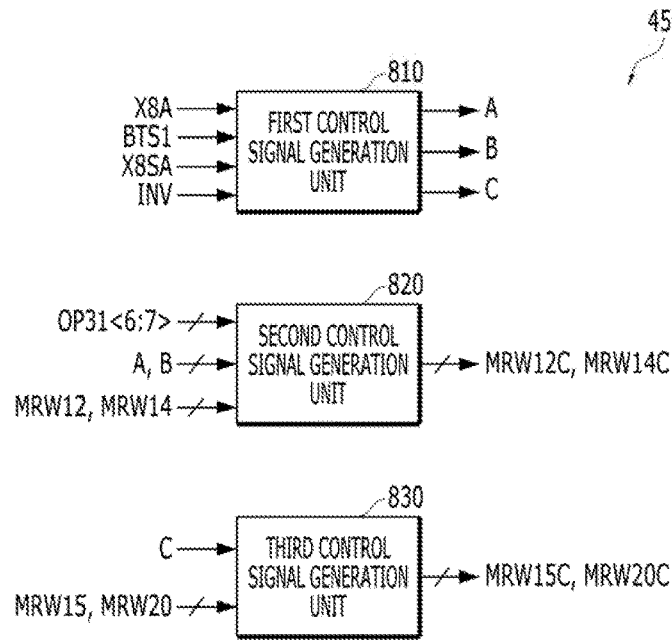
FIG. 8 is a diagram illustrating a control signal generation unit of the first semiconductor chip shown in FIG. 4.

FIG. 8 is a diagram illustrating the control signal generation unit 450 of the first semiconductor chip 210 shown in FIG. 4.

Referring to FIG. 8 the control signal generation unit 450 may include a first control signal generation unit 810, a second control signal generation unit 820, and a third control signal generation unit 830.

Figure 9:
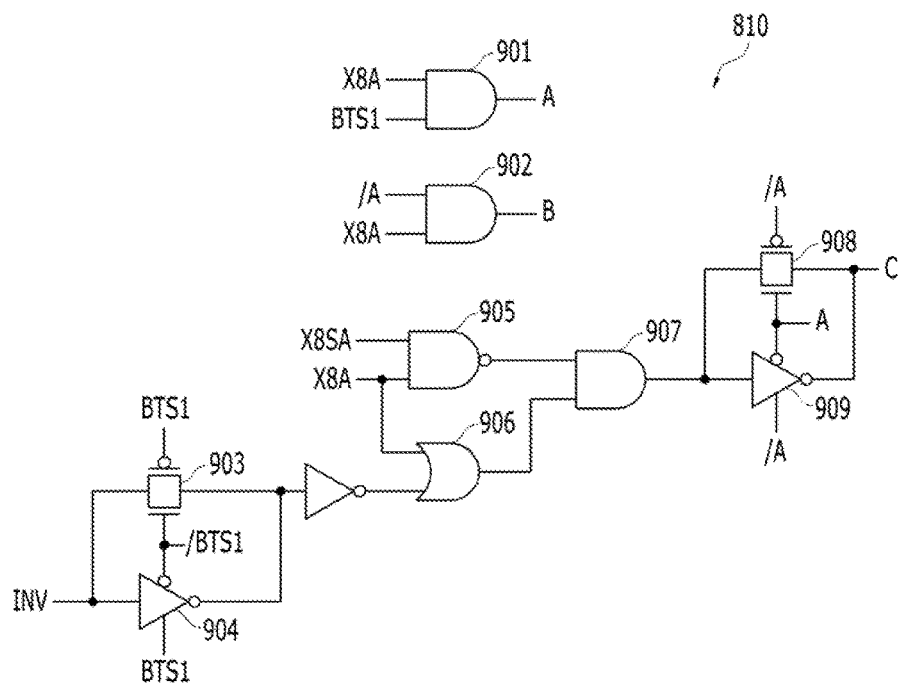
FIG. 9 is a diagram illustrating a first control signal generation unit of FIG. 8.

FIG. 9 is a diagram illustrating the first control signal generation unit 810 of FIG. 8.

Referring to FIG. 9, the first control signal generation unit 810 may include a plurality of logic gates 901 to 909. The first control signal generation unit 810 may generate the control signals A, B and C in response to the signals BTS1, X8A and X8SA and the coupling signal INV. For reference, '/A' and '/BTS1' may respectively be signals obtained by inverting logical values of the signals A and BTS1.

Figure 10:
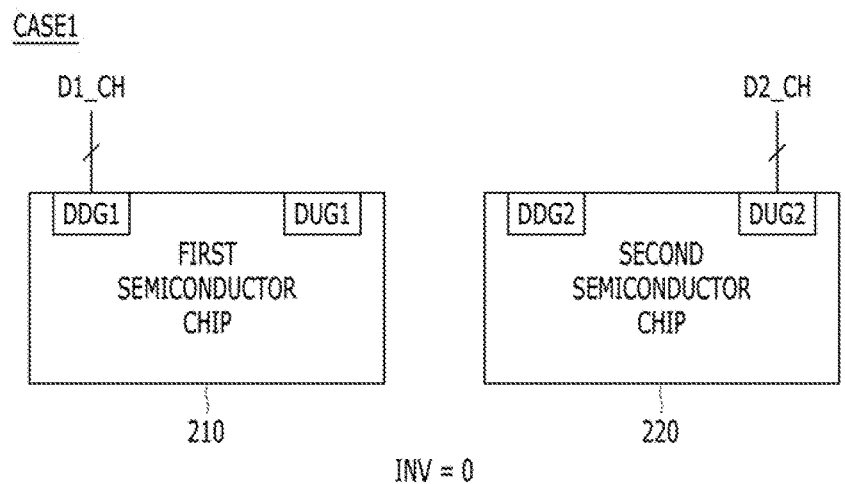
FIG. 10 is a diagram illustrating a configuration of semiconductor system according to a logical value of a coupling signal shown in FIG. 9.

FIG. 10 is a diagram describing a configuration of semiconductor system according to a logical value of the coupling signal INV shown in FIG. 9.

Referring to FIG. 10, a relationship between the first and second semiconductor chips 210 and 220 and the first and second data channel D1_CH and D2_CH in the semiconductor system 200 may be determined by one of two cases.

In a first case CASE1, the down data pad group DDG1 of the first semiconductor chip 210 may be coupled with the first data channel D1_CH, and the up data pad group DUG2 of the second semiconductor chip 220 may be coupled with the second data channel D2_CH. In this case, the value of the coupling signal INV may be '0'. Hereinbelow, the first case CASE1 may refer to a 'first coupling state'.

In a second case CASE2, the down data pad group DDG1 of the first semiconductor chip 210 may be coupled with the second data channel D2_CH, and the up data pad group DUG2 of the second semiconductor chip 220 may be coupled with the first data channel D1_CH. In this case, the value of the coupling signal INV may be '1'. Hereinbelow, the second case CASE2 may refer to a 'second coupling state'.

Hereafter, in both the first coupling state and the second coupling state, a high level voltage may be applied to the X8 pads X8A and X8B. In the case of the first coupling state, a low level voltage may be applied to the X8S pad X8SA, a low level voltage may be applied to the coupling information pad BTS1, a high level voltage may be applied to the X8S pad X8SB, and a high level voltage may be applied to the coupling information pad BTS2. In the case of the second coupling state, a low level voltage may be applied to the X8S pad X8SA, a high level voltage may be applied to the coupling information pad BTS1, a high level voltage may be applied to the X8S pad X8SB, and a low level voltage may be applied to the coupling information pad BTS2.

TABLE 2

| INV | X8A | X8SA | BTS1 | A | B | C |
|-----|-----|------|------|---|---|---|
| 0 | 0 | 0 | 0 | 0 | 0 | 0 |
| 0 | 0 | 0 | 1 | 0 | 0 | 1 |
| 0 | 0 | 1 | 0 | 0 | 0 | 0 |
| 0 | 0 | 1 | 1 | 0 | 0 | 1 |
| 0 | 1 | 0 | 0 | 0 | 1 | 0 |
| 0 | 1 | 0 | 1 | 1 | 0 | 1 |
| 0 | 1 | 1 | 0 | 0 | 1 | 1 |
| 0 | 1 | 1 | 1 | 1 | 0 | 0 |
| 1 | 0 | 0 | 0 | 0 | 0 | 1 |
| 1 | 0 | 0 | 1 | 0 | 0 | 0 |
| 1 | 0 | 1 | 0 | 0 | 0 | 1 |
| 1 | 0 | 1 | 1 | 0 | 0 | 0 |
| 1 | 1 | 0 | 0 | 0 | 1 | 0 |
| 1 | 1 | 0 | 1 | 1 | 0 | 1 |
| 1 | 1 | 1 | 0 | 0 | 1 | 1 |
| 1 | 1 | 1 | 1 | 1 | 0 | 0 |

[Table 2] illustrates logical values of output signals A, B and C of the first control signal generation unit 810 depending on logical values of signals inputted to the first control signal generation unit 810. Referring to [Table 2], in the case of the first coupling state, the control signals A, B and C of the first semiconductor chip 210 may be respectively 0, 1 and 0, and the control signals A, B and C of the second semiconductor chip 220 may be respectively 1, 0 and 0. In the case of the second coupling state, the control signals A, B and C of the first semiconductor chip 210 may be respectively 1, 0 and 1, and the control signals A, B and C of the second semiconductor chip 220 may be respectively 0, 1 and 1.

Figure 11:
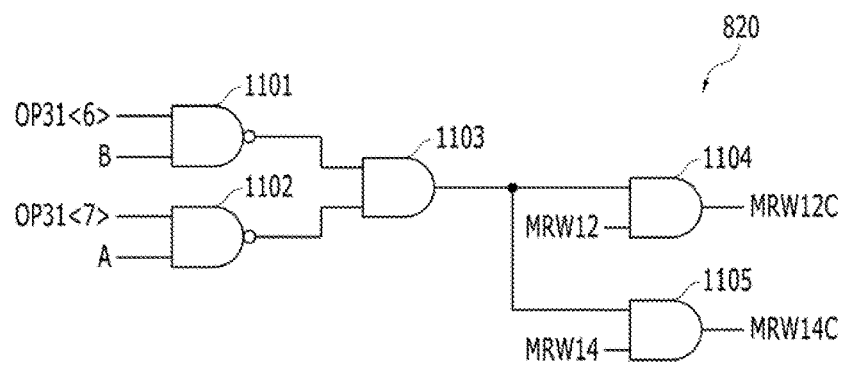
FIG. 11 is a diagram illustrating a second control signal generation unit of FIG. 8.

FIG. 11 is a diagram illustrating the second control signal generation unit 820 of FIG. 8.

Referring to FIG. 11, the second control signal generation unit 820 may include a plurality of logic gates 1101 to 1105. The second control signal generation unit 820 may generate control signals MRW12C and MRW13C in response to the control signals A and B, the setting information OP31<6:7> and the setting commands MRW12 and MRW14.

TABLE 3

| A | B | OP31<6> | OP31<7> | MRW12C | MRW14C |
|---|---|---------|---------|--------|--------|
| 0 | 0 | 0 | 0 | The same as MRW12 | The same as MRW14 |
| 0 | 0 | 0 | 1 | The same as MRW12 | The same as MRW14 |
| 0 | 0 | 1 | 0 | The same as MRW12 | The same as MRW14 |
| 0 | 0 | 1 | 1 | The same as MRW12 | The same as MRW14 |
| 0 | 1 | 0 | 0 | The same as MRW12 | The same as MRW14 |
| 0 | 1 | 0 | 1 | The same as MRW12 | The same as MRW14 |
| 0 | 1 | 1 | 0 | 0 | 0 |
| 0 | 1 | 1 | 1 | 0 | 0 |
| 1 | 0 | 0 | 0 | The same as MRW12 | The same as MRW14 |
| 1 | 0 | 0 | 1 | 0 | 0 |
| 1 | 0 | 1 | 0 | The same as MRW12 | The same as MRW14 |
| 1 | 0 | 1 | 1 | 0 | 0 |
| 1 | 1 | 0 | 0 | The same as MRW12 | The same as MRW14 |
| 1 | 1 | 0 | 1 | 0 | 0 |
| 1 | 1 | 1 | 0 | 0 | 0 |
| 1 | 1 | 1 | 1 | 0 | 0 |

[Table 3] illustrates logical values of output signals MRW12C and MRW14C depending on logical values of signals A, B and OP31<6:7> inputted to the second control signal generation unit 820.

Figure 12:
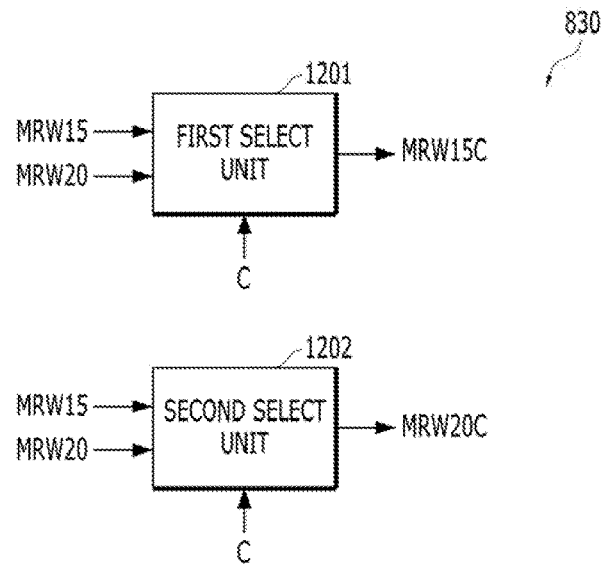
FIG. 12 is a diagram illustrating a third control signal generation unit of FIG. 8.

FIG. 12 is a diagram of the third control signal generation unit 830 of FIG. 8.

Referring to FIG. 12, the third control signal generation unit 830 may include first and second select units 1201 and 1202.

The first select unit 1201 may select, when the control signal C is '0', the setting command MRW15 and output it as the control signal MRW15C, and may select, when the control signal C is '1', the setting command MRW20 and output it as the control signal MRW15C. The second select unit 1202 may select, when the control signal C is '0', the setting command MRW20 and output it as the control signal MRW20C, and may select, when the control signal C is '1', the setting command MRW15 and output it as the control signal MRW20C.

The on-die termination control unit 470 may control termination resistance values of the CS pad CS1, the CK pad CK1 and the CA pads CA0 to CA1 in response to the setting information OP11<4:6> and OP22<6:7> and the control signals A, B, ODT, MR_CA, MR_CS and MR_CK.

Figure 13:
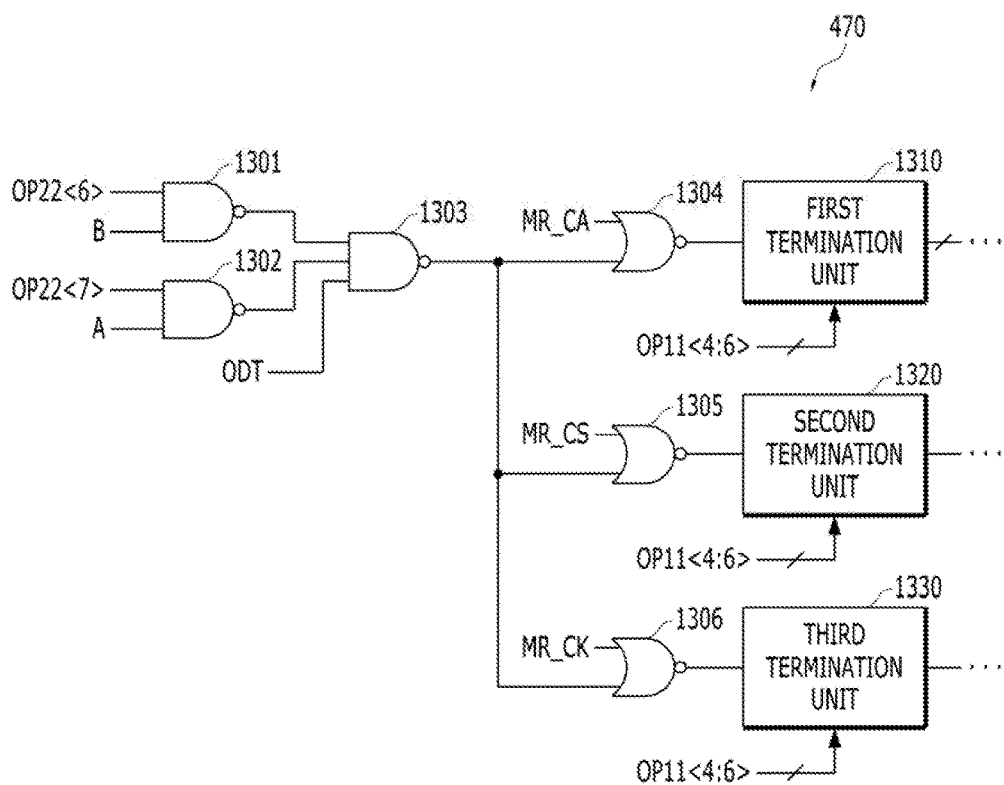
FIG. 13 is a diagram illustrating an on-die termination control unit of the first semiconductor chip shown in FIG. 4.

FIG. 13 is a diagram illustrating the on-die termination control unit 470 of the first semiconductor chip 210 shown in FIG. 4.

Referring to FIG. 13, the on-die termination control unit 470 may include first to third termination units 1310, 1320 and 1330 and a plurality of logic gates 1301 to 1306.

The first termination unit 1310 may be coupled to each of the CA pads CA0 to CA5 and control the termination resistance of the CA pads CA0 to CA5 when an output signal of the logic gate 1304 is a high level signal. The first termination unit 1310 may be disabled when the output signal of the logic gate 1304 is a low level signal.

The second termination unit 1320 may be coupled to the CS pad CS1 and control the termination resistance of the CS pad CS1 when an output signal of the logic gate 1305 is a high level signal. The second termination unit 1320 may be disabled when the output signal of the logic gate 1305 is a low level signal.

The third termination unit 1330 may be coupled to the CK pad CK1 and control the termination resistance of the CK pad CK1 when an output signal of the logic gate 1306 is a high level signal. The third termination unit 1330 may be disabled when the output signal of the logic gate 1306 is a low level signal.

For reference, when the first to third termination units 1310 to 1330 are enabled, the termination resistance value may be determined by the setting information OP11<4:6>.

The on-die termination signal ODT may be a signal applied to control the on-die termination function from the outside of the semiconductor system 200. When the on-die termination signal ODT is a low level signal, all of the first to third termination units 1310 to 1330 may be disabled. When the on-die termination signal ODT is a high level signal, enabling/disabling of the first to third termination units 1310 to 1330 may be determined by the setting Information OP22<6:7> and the control signals A, B, MR_CA, MR_CS, and MR_CK.

The control signal MR_CA may be a signal for individually controlling an operation of the first termination unit 1310. When the control signal MR_CA is a low level signal, enabling/disabling of the first termination unit 1310 may be determined by an output signal of the logic gate 1303. The control signal MR_CS may be a signal for individually controlling an operation of the second termination unit 1320. When the control signal MR_CS is a low level signal, enabling/disabling of the second termination unit 1320 may be determined by the output signal of the logic gate 1303. The control signal MR_CK may be a signal for individually controlling an operation of the third termination unit 1330. When the control signal MR_CK is a low level signal, enabling/disabling of the third termination unit 1330 may be determined by the output signal of the logic gate 1303.

TABLE 4

| A | B | OP22<6> | OP22<7> | Output of 1303 |
|---|---|---------|---------|----------------|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

[Table 4] illustrates the logical value of the output signal of the logic gate 1303 depending on logical values of the control signals A and B and the setting information OP22<6:7>, in a state that the on-die termination signal ODT is a high level signal. When the output signal of the logic gate 1303 is a low level signal, enabling/disabling of the first to third termination units 1310 to 1330 may be respectively determined by the corresponding control signals MR_CA, MR_CS and MR_CK. When the output signal of the logic gate 1303 is a high level signal, all of the first to third termination units 1310 to 1330 may be disabled.

When the first to third termination units 1301 to 1330 are enabled, the resistance values thereof may be controlled depending on the value of the setting information OP<4:6>.

The reference voltage generation unit 480 may generate the CA reference voltage VREF_CA having a level corresponding to the value of the setting information OP12<0:6> and generate the data reference voltage VERF_DQ having a level corresponding to the value of the setting information OP14<0:6>.

The data output control unit 491 may arrange data to be inputted or outputted through the down data pads DQ0 to DQ7 of the down data pad group DDG1. During a data output operation, the data output control unit 491 may selectively invert data to be outputted to the down data pads DQ0 to DQ7 in response to the setting information OP15<0:7>. The data output control unit 492 may arrange data to be inputted or outputted through up data pads DQ8 to DQ15 of the up data pad group DUG1. During a data output operation, the data output control unit 492 may selectively invert data to be outputted to the up data pads DQ8 to DQ15 in response to the setting information OP20<0:7>.

The second semiconductor chip 220 may have the same configuration and operation as those of the first semiconductor chip 210 with only a difference in a state of coupling with the data channel. The words "difference in the state of coupling with the data channel" may refer to the fact that when the down data pads DQ0 to DQ7 of the first semiconductor chip 210 are coupled with the first data channel D1_CH, the up data pads DQ8 to DQ15 of the second semiconductor chip 220 are coupled with the second data channel D2_CH, and when the down data pads DQ0 to DQ7 of the first semiconductor chip 210 are coupled with the second data channel D2_CH, the up data pads DQ8 to DQ15 of the second semiconductor chip 220 are coupled with the first data channel D1_CH.

Figure 14:
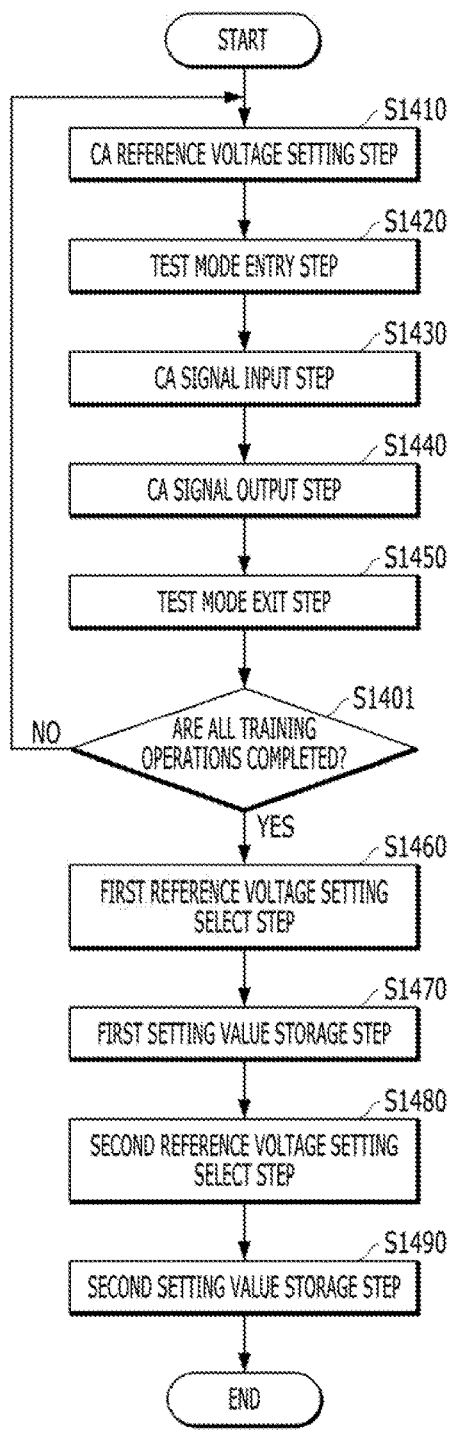
FIG. 14 is a flowchart illustrating a first CA training operation of a semiconductor system in accordance with an embodiment of the present invention.

FIG. 14 is a flowchart illustrating a first CA training operation of a semiconductor system in accordance with an embodiment of the present invention.

Referring to FIG. 14, the first CA training operation may include a CA reference voltage setting step S1410, a test mode entry step S1420, a CA signal input step S1430, a CA signal output step S1440, a test mode exit step S1450, a first reference voltage setting select step S1460, a first setting value storage step S1470, a second reference voltage setting select step S1480, and a second setting value storage step S1490. The first CA training operation may be an operation for optimizing the CA reference voltage VREF_CA. In an initial state, the value of the setting information OP31<6:7> may be set to '00'.

At the CA reference voltage setting step S1410, the first and second semiconductor chips 210 and 220 may enable the setting command MRW12 and the control signal MRW12C in response to CA signals inputted through the CA pad groups CAG1 and CAG2, and the mode register set MRS12 may enter a settable state. In this state, setting information having the same value may be stored in the mode register sets MRS12 of the first and second semiconductor chips 210 and 220 in response to CA signals inputted through the CA pad groups CAG1 and CAG2. Therefore, the CA reference voltages VREF_CA of the first and second semiconductor chips 210 and 220 may be set to the same level. This operation may be performed in the same manner regardless of whether the semiconductor system is in the first coupling state or the second coupling state.

At the test mode entry step S1420, the first and second semiconductor chips 210 and 220 may enter a test mode in response to CA signals inputted through the CA pad groups CAG1 and CAG2.

At the CA signal input step S1430, the first and second semiconductor chips 210 and 220 may receive CA signals having patterns set through the CA pad groups CAG1 and CAG2, buffer the CA signals through the CA buffers CB0 to CB5, and then store internal CA signals CAI in the mode register set or internal circuit 401. Hereinbelow, the CA signals having set patterns, inputted at the CA signal input step S1430, may refer to 'test CA signals'.

At the CA signal output step S1440, the stored test CA signals may be outputted to the outside through the data pads. In the case of the first coupling state, the first semiconductor chip 210 may output the test CA signals to the outside of the semiconductor system 200 through the down data pads DQ0 to DQ7 and the first data channel D1_CH, and the second semiconductor chip 220 may output the test CA signals to the outside of the semiconductor system 200 through the up data pads DQ8 to DQ15 and the second data channel D2_CH. In the case of the second coupling state, the first semiconductor chip 210 may output the test CA signals to the outside of the semiconductor system 200 through the down data pads DQ0 to DQ7 and the second data channel D2_CH, and the second semiconductor chip 220 may output the test CA signals to the outside of the semiconductor system 200 through the up data pads DQ8 to DQ15 and the first data channel D1_CH.

After the output of the test CA signals has been completed, at the test mode exit step S1450, the first and second semiconductor chips 210 and 220 may exit the test mode in response to CA signals inputted through the CA pad groups CAG1 and CAG2.

At step S1401, if all of the training operations have been completed (YES), the process may move to the first reference voltage setting select step S1460, and if all of the training operations have not been completed (NO), the process may be repeatedly performed from the CA reference voltage setting step S1410 to the test mode exit step S1450. A test apparatus (not shown in FIG. 2) coupled to the semiconductor system 200 may compare the test CA signals inputted to the first and second semiconductor chips 210 and 220 with the test CA signals outputted from the first and second semiconductor chips 210 and 220 and detect how accurate the buffering of the test CA signals in the first and second semiconductor chips 210 and 220 has been performed.

To optimize the width of valid windows in a single level of the CA reference voltage VREF_CA, the degree to which inputted test CA signals and outputted test CA signals correspond to each other may be checked while test CA signals having various patterns are Inputted to and outputted from the first and second semiconductor chips 210 and 220, and are in a state that the level of the CA reference voltage VREF_CA is fixed. If such operations are performed in a state that the level of the CA reference voltage VREF_CA changes, concordance rates between the inputted test CA signals and the outputted test CA signals with regard to various levels of CA reference voltages VREF_CA may be measured. In this regard, the optimum level of the CA reference voltage VREF_CA may be defined as a level of the CA reference voltage VREF_CA when the concordance rate between the inputted test CA signals and the outputted test CA signals in various test CA signal patterns is highest. Furthermore, a value of setting information hereinafter, referring to as a 'CA reference voltage optimum value', corresponding to the optimum level of the CA reference voltage VREF_CA may be present. In particular, the first and second semiconductor chips 210 and 220 may have different CA reference voltage optimum values. Hereinbelow, the CA reference voltage optimum value of the first semiconductor chip 210 will refer to a 'first optimum setting value', and the CA reference voltage optimum value of the second semiconductor chip 220 will refer to a 'second optimum setting value'.

At the first reference voltage setting select step S1460, the setting command MRW31 may be enabled in response to CA signals inputted through the CA pad groups CAG1 and CAG2, and the setting information OP31<6:7> may be stored as '01'.

At the first setting value storage step S1470, the setting command MRW12 may be enabled in response to CA signals inputted through the CA pad groups CAG1 and CAG2. In this regard, in the case of the first coupling state, since the control signals A and B of the first semiconductor chip 210 are '0' and '1' and the value of setting information OP31<6:7> is '01', the control signal MRW12C may be enabled in response to the setting command MRW12. However, since the control signals A and B of the second semiconductor chip 220 are '1' and '0' and the value of the setting information OP31<6:7> is '01', the control signal MRW12C is not enabled even when the setting command MRW12 is enabled. Therefore, at the first setting value storage step S1470, the setting information inputted to the first and second semiconductor chips 210 and 220 through the CA pad groups CAG1 and CAG2 may be stored in only the mode register set MRS12 of the first semiconductor chip 210.

On the contrary to the above-mentioned case, in the case of the second coupling state, at the first setting value storage step S1470, the setting information inputted to the first and second semiconductor chips 210 and 220 through the CA pad groups CAG1 and CAG2 may be stored in only the mode register set MRS12 of the second semiconductor chip 220.

After the storage of the first setting value has been completed, the process may move to the second reference voltage setting select step S1480. At the second reference voltage setting select step S1480, the setting command MRW31 may be enabled in response to CA signals inputted through the CA pad groups CAG1 and CAG2, and the setting information OP31<6:7> may be stored as '10'.

At the second setting value storage step S1490, the setting command MRW12 may be enabled in response to CA signals inputted through the CA pad groups CAG1 and CAG2. In this regard, in the case of the first coupling state, since the control signals A and B of the first semiconductor chip 220 are '0' and '1' and the value of setting information OP31<6:7> is '10', the control signal MRW12C is not enabled even when the setting command MRW12 is enabled.

However, since the control signals A and B of the second semiconductor chip 220 are '1' and '0' and the value of the setting information OP31<6:7> is '10', the control signal MRW12C may be enabled in response to the setting command MRW12. Therefore, at the second setting value storage step S1490, the setting information inputted to the first and second semiconductor chips 210 and 220 through the CA pad groups CAG1 and CAG2 may be stored in only the mode register set MRS12 of the second semiconductor chip 220.

On the contrary to the above-mentioned case, in the case of the second coupling state, at the second setting value storage step S1490, the setting information inputted to the first and second semiconductor chips 210 and 220 through the CA pad groups CAG1 and CAG2 may be stored in only the mode register set MRS12 of the first semiconductor chip 210.

Accordingly, in the case of the first coupling state, at the first setting value storage step S1470, the first optimum setting value may be inputted to the first and second semiconductor chips 210 and 220 and stored in only the first semiconductor chip 210, and, at the second setting value storage step S1490, the second optimum setting value may be inputted to the first and second semiconductor chips 210 and 220 and stored in only the second semiconductor chip 220. In the case of the second coupling state, at the first setting value storage step S1470, the second optimum setting value may be inputted to the first and second semiconductor chips 210 and 220 and stored in only the second semiconductor chip 220, and, at the second setting value storage step S1490, the first optimum setting value may be inputted to the first and second semiconductor chips 210 and 220 and stored in only the first semiconductor chip 210.

In accordance with the embodiment of the present invention, when the CA reference voltage VREF_CA is set using the semiconductor system 200 of FIG. 2, the optimum setting values may be respectively stored in the first and second semiconductor chips 210 and 220 even though the first and second semiconductor chips 210 and 220 share command and address (CA) information transferred through the CA channel CA_CH.

Figure 15:
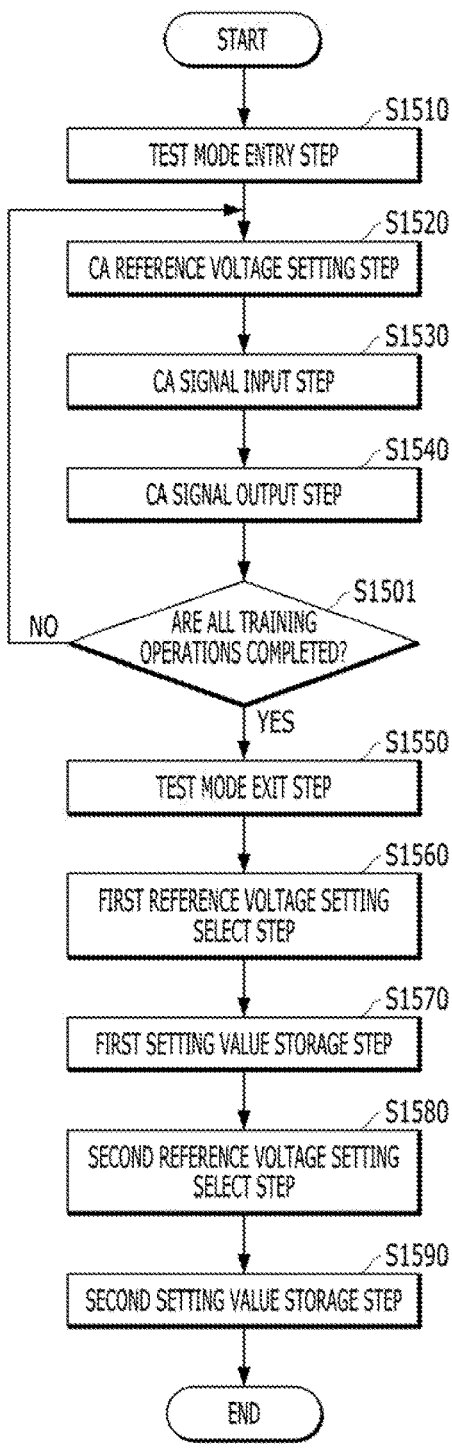
FIG. 15 is a flowchart illustrating a second CA training operation of a semiconductor system in accordance with an embodiment of the present invention.

FIG. 15 is a flowchart illustrating a second CA training operation of a semiconductor system in accordance with an embodiment of the present invention.

Referring to FIG. 15, the second CA training operation may include a test mode entry step S1510, a CA reference voltage setting step S1520, a CA signal input step S1530, a CA signal output step S1540, a test mode exit step S1550, a first reference voltage setting select step S1560, a first setting value storage step S1570, a second reference voltage setting select step S1580, and a second setting value storage step S1590.

At the test mode entry step S1510, when the second CA training operation is set, the training mode signal CBT2 may be enabled.

Unlike the first CA training operation, in the second CA training operation, at the CA reference voltage setting step S1520, signals for enabling the setting command MRW12 and setting information for storing the signals in the mode register set MRS12 may be inputted through the data pads DQ0 to DQ7 or DQ8 to DQ15. In the case of the first coupling state, the first semiconductor chip 210 may receive the signals, that is, the input data DDI, through the first data channel D1_CH and the down data pads DQ0 to DQ7, and the second semiconductor chip 220 may receive the signals, that is, the input data DUI, through the second data channel D2_CH and the up data pads DQ8 to DQ15. In the case of the second coupling state, the first semiconductor chip 210 may receive the signals, that is, the input data DDI, through the second data channel D2_CH and the down data pads DQ0 to DQ7, and the second semiconductor chip 220 may receive the signals, that is, the input data DUI, through the first data channel D1_CH and the up data pads DQ8 to DQ15.

Thereby, in the second CA training operation, the test mode entry step S1510 and the test mode exit step S1550 may be respectively performed only once from when the second CA training operation begins to when the test is completed. Therefore, only the CA reference voltage setting step S1520, the CA signal input step S1530 and the CA signal output step S1540 may be repeatedly performed. Consequently, the time needed to perform the training operation may be reduced.

At step S1501, if all of the training operations have been completed (YES), the process may move to the test mode exit step S1550, and if all of the training operations have not been completed (NO), the process may be repeatedly performed from the CA reference voltage setting step S1520 to the CA signal output step S1540.

The first reference voltage setting select step S1560, the first setting value storage step S1570, the second reference voltage setting select step S1580 and the second setting value storage step S1590 may be substantially the same as the corresponding respective steps S1460 to S1490 of FIG. 14.

Figure 16:
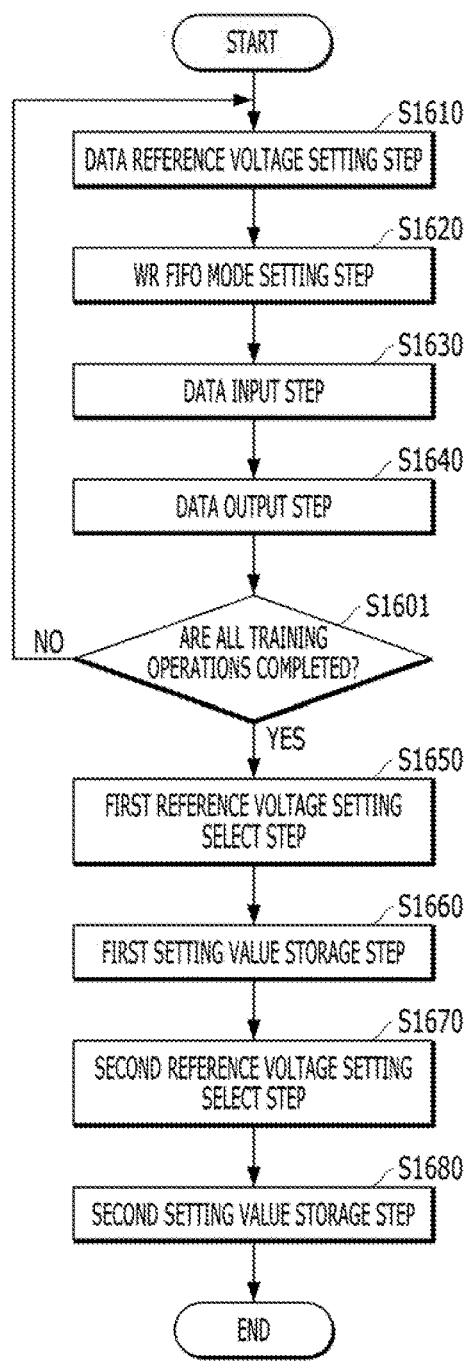
FIG. 16 is a flowchart illustrating a write training operation of a semiconductor system in accordance with an embodiment of the present invention.

FIG. 16 is a flowchart illustrating a write training operation of a semiconductor system in accordance with an embodiment of the present invention.

Referring to FIG. 16, the write training operation may include a data reference voltage setting step S1610, a WR FIFO mode setting step S1620, a data input step S1630, a data output step S1640, a first reference voltage setting select step S1650, a first setting value storage step S1660, a second reference voltage setting select step S1670 and a second setting value storage step S1680. The write training operation may be an operation for optimizing the data reference voltage VREF_DQ. In an initial state, the value of the setting information OP31<6:7> may be set to '00'.

At the data reference voltage setting step S1610, the first and second semiconductor chips 210 and 220 may enable the setting command MRW14 and the control signal MRW14C in response to CA signals inputted through the CA pad groups CAG1 and CAG2, and the mode register set MRS14 may enter a settable state. In this state, setting information having the same value may be stored in the mode register sets MRS14 of the first and second semiconductor chips 210 and 220 in response to CA signals inputted through the CA pad groups CAG1 and CAG2. Therefore, the data reference voltages VREF_DQ of the first and second semiconductor chips 210 and 220 may be set to the same level. This operation may be performed in the same manner regardless of whether the semiconductor system is in the first coupling state or the second coupling state.

At the WR FIFO mode setting step S1620, the setting commands MPC may be enabled in the first and second semiconductor chips 210 and 220 in response to CA signals inputted through the CA pad groups CAG1 and CAG2, and the second mode setting unit 462 may enter a settable state. In this state, the first and second semiconductor chips 210 and 220 may be set to the WR FIFO mode in response to CA signals inputted through the CA pad groups CAG1 and CAG2.

At the data input step S1630, the first and second semiconductor chips 210 and 220 may respectively receive data having set patterns through the data pads DQ0 to DQ7 and DQ8 to DQ15, and buffer and store the data in the portion of the internal circuit 401 except for the cell array ARRAY. Hereinbelow, the data having set patterns, inputted at the data input step S1630, may refer to 'test data'.

At the data output step S1640, the stored test data may be outputted to the outside through the data pads DQ0 to DQ7 and DQ8 to DQ15. In the case of the first coupling state, the first semiconductor chip 210 may output the test data to the outside of the semiconductor system 200 through the down data pads DQ0 to DQ7 and the first data channel D1_CH, and the second semiconductor chip 220 may output the test data to the outside of the semiconductor system 200 through the up data pads DQ8 to DQ15 and the second data channel D2_CH. In the case of the second coupling state, the first semiconductor chip 210 may output the test data to the outside of the semiconductor system 200 through the down data pads DQ0 to DQ7 and the second data channel D2_CH, and the second semiconductor chip 220 may output the test data to the outside of the semiconductor system 200 through the up data pads DQ8 to DQ15 and the first data channel D1_CH.

At step S1601, if all of the training operations have been completed (YES), the process may move to the first reference voltage setting select step S1650, and if all of the training operations have not been completed (NO), the process may be repeatedly performed from the CA reference voltage setting step S1610 to the data output step S1640. The test apparatus (not shown in FIG. 2) coupled to the semiconductor system 200 may compare the test data inputted to the first and second semiconductor chips 210 and 220 with the test data outputted from the first and second semiconductor chips 210 and 220 and detect how accurately the buffering of the test data in the first and second semiconductor chips 210 and 220 has been performed.

To optimize the width of valid windows in a single level of the data reference voltage VREF_DQ, the degree to which inputted test data and outputted test data correspond to each other may be checked while test data having various patterns are inputted to and outputted from the first and second semiconductor chips 210 and 220 at various data-strobe time intervals, in a state in which the level of the data reference voltage VREF_DQ is fixed. In this regard, the term 'data-strobe time interval' may refer to a difference in phase between data and a strobe signal DQS. If such operations are performed in a state in which the level of the data reference voltage VREF_DQ changes, concordance rates between the inputted test data and the outputted test data with regard to various levels of data reference voltages VREF_DQ may be measured.

In this regard, the optimum level of the data reference voltage VREF_DQ may be defined as a level of the data reference voltage VREF_DQ when the concordance rate between the inputted test data and the outputted test data in various test data patterns and at various data-strobe time intervals is highest. Furthermore, a value of setting information hereinafter, referring to as a 'data reference voltage optimum value', corresponding to the optimum level of the data reference voltage VREF_DQ may be present. In particular, the first and second semiconductor chips 210 and 220 may have different data reference voltage optimum values. Hereinbelow, the data reference voltage optimum value of the first semiconductor chip 210 will refer to a 'first optimum setting value', and the data reference voltage optimum value of the second semiconductor chip 220 will refer to a 'second optimum setting value'.

The first reference voltage setting select step S1650, the first setting value storage step S1660, the second reference voltage setting select step S1670 and the second setting value storage step S1680 may be similar to the corresponding respective steps S1460 to S1490 of FIG. 14. The only difference is that the steps S1650 to S1690 are operations for storing setting information which set the level of the data reference voltage VREF_DQ in the mode register set MRS14 using the setting command MRW14 while the steps S1460 to S1490 are operations for storing setting information about setting the CA reference voltage VREF_CA in the mode register set MRS12 using the setting command MRW12.

Figure 17:
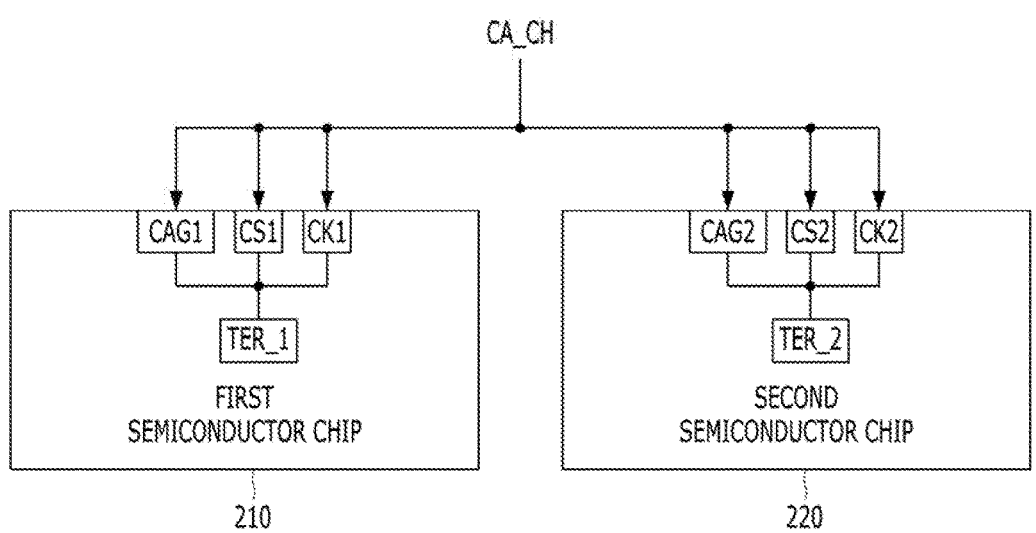
FIG. 17 is a diagram illustrating a case in which an on-die termination function is disabled.

FIG. 17 is a diagram illustrating a case in which the on-die termination function is disabled.

Referring to FIG. 17, the first semiconductor chip 210 and the second semiconductor chip 220 may share the CA channel CA_CH. In each of the semiconductor chips 210 and 220, an on-die termination control unit TER_1, TER_2 corresponding to the on-die termination control unit 470 of FIG. 4, may be coupled to the CA pad group CAG1, CAG2, the CS pads CS1, CS2, and the CK pads CK1, CK2 and perform a termination operation.

However, during a training operation, when both the on-die termination control units TER_1 and TER_2 of the first and second semiconductor chips 210 and 220 are enabled, the termination resistance value may become half of a target resistance value needed for the training operation due to the sharing of the CA channel CA_CH. Therefore, the on-die termination function of one of the first and second semiconductor chips 210 and 220 needs to be disabled during the training operation.

TABLE 5

| | first coupling state | second coupling state |
| --- | --- | --- |
| OP22<6:7> = 10 | Disable on-die termination function of first semiconductor chip (210) | Disable on-die termination function of second semiconductor chip (220) |
| OPP22<6:7> = 01 | Disable on-die termination function of second semiconductor chip (220) | Disable on-die termination function of first semiconductor chip (210) |

[Table 5] Illustrates how to selectively disable the on-die termination function of the first and second semiconductor chips 210 and 220 depending on the setting information OP22<6:7> and the coupling state.

Hereinbelow, a setting operation of an output data invert mode will be described.

In the first and second semiconductor chips 210 and 220, regardless of the coupling state, a first output data invert mode for the down data pads DQ0 to DQ7 may be set depending on setting information stored in the mode register set MRS15, and a second output data invert mode the up data pads DQ8 to DQ15 may be set depending on setting information stored in the mode register set MRS20.

A controller provided in the outside of the semiconductor system 200 may set, without taking into account an internal coupling state of the semiconductor system 200, the output data invert mode on the assumption that the first data channel D1_CH corresponds to the down data pad DQ0 to DQ7 and the second data channel D2_CH corresponds to the up data pads DQ8 to DQ15.

That is, to set the first output data invert mode for the down data pad DQ0 to DQ7 which is coupled to the first data channel D1_CH, the controller may apply setting information and CA signals for enabling the setting command MRW15 through the CA pad groups CAG1 and CAG2. In addition, to set the second output data invert mode for the up data pads DQ8 to DQ15 which are coupled to the second data channel D2_CH, the controller may apply setting information and CA signals for enabling the setting command MRW20 through the CA pad groups CAG1 and CAG2. In the case of the first coupling state, there are no problems since it is the same as the coupling state assumed in the controller.

However, in the case of the second coupling state, the controller has to consider the fact that the down data pads DQ0 to DQ7 of the first semiconductor chip 210 are coupled to the second data channel D2_CH and the up data pads DQ8 to DQ15 of the second conductor chip 220 are coupled to the first data channel D1_CH.

In the case of the conventional semiconductor system, setting commands MRW15 and MRW20 are generated depending on CA signals inputted from the outside, regardless of the coupling state. In the case of the second coupling state, only the second output data invert mode can be set in the first semiconductor chip 210 coupled to the second data channel D2_CH, and only the first output data invert mode can be set in the second semiconductor chip 220 coupled to the first data channel D1_CH. That is, in each semiconductor chip, the output data invert mode is set only for the data pads that are not coupled with the data channel.

However, in the semiconductor system 200 of FIG. 2 and the first semiconductor chip 210 of FIG. 4, the above-mentioned concern is not caused.

In the case of the first coupling state, since the control signal C is '0', the control signal MRW15C is enabled in response to the setting command MRW15, and the control signal MRW20C is enabled in response to the setting command MRW20. Hence, the output data invert mode may be set without causing any concern such as that of the conventional art.

In the case of the second coupling state, since the control signal C is '1', the control signal MRW20C may be enabled in response to the setting command MRW15, and the control signal MRW15C may be enabled in response to the setting command MRW20. This means that, when CA signals for setting the output data invert mode of the data pads that correspond to the first data channel D1_CH are inputted, the second output data invert mode is set in the second semiconductor chip 220, and, when CA signals for setting the output data invert mode of the data pads that correspond to the second data channel D2_CH are inputted, the first output data invert mode is set in the first semiconductor chip 210.

Therefore, each of the first and second semiconductor chips 210 and 220 may set the output data invert mode of the data pads that are coupled with the corresponding one of the data channels D1_CH and D2_CH. Any concern such as that in the conventional art, is not caused.

Figure 18:
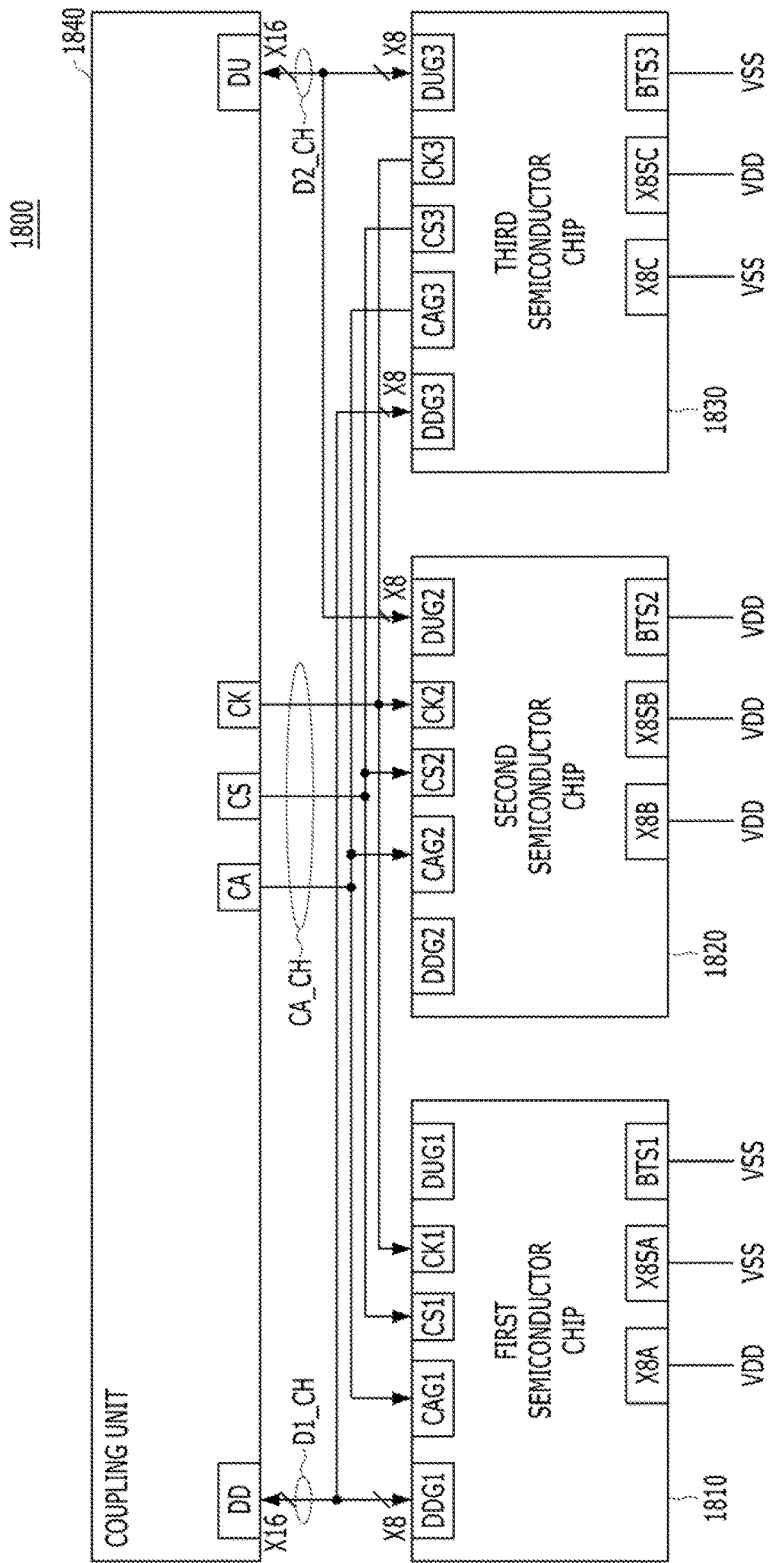
FIG. 18 is a diagram illustrating a semiconductor system in accordance with an embodiment of the present invention.

FIG. 18 is a diagram illustrating a semiconductor system 1800 in accordance with an embodiment of the present invention.

Referring to FIG. 18, the semiconductor system 1800 may include first to third semiconductor chips 1810 to 1830 and a coupling unit 1840.

The first to third semiconductor chips 1810 to 1830 may respectively include CA pad groups CAG1 to CAG3, clock pads CK1 to CK3, chip select pads CS1 to CS3, down data pad groups DDG1 to DDG3, up data pad groups DUG1 to DUG3, coupling information pads BTS1 to BTS3, and X8 pads X8A to X8C, and X8S pads X8SA to X8SC. The pad group may refer to a group including one or more pads. Each of the first to third semiconductor chips 1810 to 1830 may have the same configuration as the semiconductor chip described with reference to FIGS. 2 to 13. The first and second semiconductor chips 1810 and 1820 may be operated in the same manner as those of the first and second semiconductor chips 210 and 220 of FIG. 2, respectively.

The coupling unit 1840 may have a configuration for coupling the first to third semiconductor chips 1810 to 1830 with the outside of the semiconductor system 1800. The coupling unit 1840 may include a CA coupling unit CA, a CS coupling unit CS, a CK coupling unit CS, a down data coupling unit DD, and an up data coupling unit DU. Each of the CS coupling unit CS and the CK coupling unit CK may include a single ball which is coupled to the outside of the semiconductor system 1800 to transmit a chip select signal or a clock signal. For each CA coupling unit CA, the down data coupling unit DD and the up data coupling unit DU may include a plurality of balls which are coupled to the outside of the semiconductor system 1800 to transmit a plurality of CA signals or a plurality of data signals.

The down data coupling unit DD may be coupled with the down data pad group DDG1 of the first semiconductor chip 1810 through some of a plurality of lines included in the first data channel D1_CH, and may be coupled with the down data pad group DDG3 of the third semiconductor chip 1830 through the other lines. The up data coupling unit DU may be coupled with the up data pad group DUG2 of the second semiconductor chip 1820 through some of a plurality of lines included in the second data channel D2_CH, and may be coupled with the up data pad group DUG3 of the third semiconductor chip 1830 through the other lines.

The term 'X16' may mean that the number of lines included in each of the first and second data channels D1_CH and D2_CH respectively coupled to the down and up data coupling units DD and DU is sixteen. The term 'X8' may mean that the number of lines coupled to each of the down and up data pad groups DDG1, DUG2, DDG3 and DUG3 is eight.

The first to third semiconductor chips 1810 to 1830 may share a CA channel CA_CH and thus receive the same CA information including the CA signals and the chip select signal and the clock signal. While each of the first and second semiconductor chips 1810 and 1820 uses only eight of the given sixteen data pads, the third semiconductor chip 1830 may use all of the sixteen data pads. For this, a ground voltage VSS may be applied to the X8 pad X8C, a power supply voltage VDD may be applied to the X8S pad X8SC, and the ground voltage VSS may be applied to the coupling information pad BTS3.

With regard to the third semiconductor chip 1830, when the ground voltage VSS is applied to the X8 pad X8C, the third semiconductor chip 1830 has to originally operate with first read latency. However, when a combination of signals is applied to the X8 pad X8C and the X8S pad X8SC includes a low level signal and a high level signal, the third semiconductor chip 1830 may input or output data using both the down and up data pad groups DDG3 and DUG3 and be set such that it operates with second latency. Therefore, the third semiconductor chip 1830 may be set to have the same read latency as that of the first and second semiconductor chips 1810 and 1820.

As described above, the semiconductor system 1800 of FIG. 18 may include the first to third semiconductor chips 1810 to 1830, which have the same configuration and input or output data in different forms depending on settings.

Figure 19:
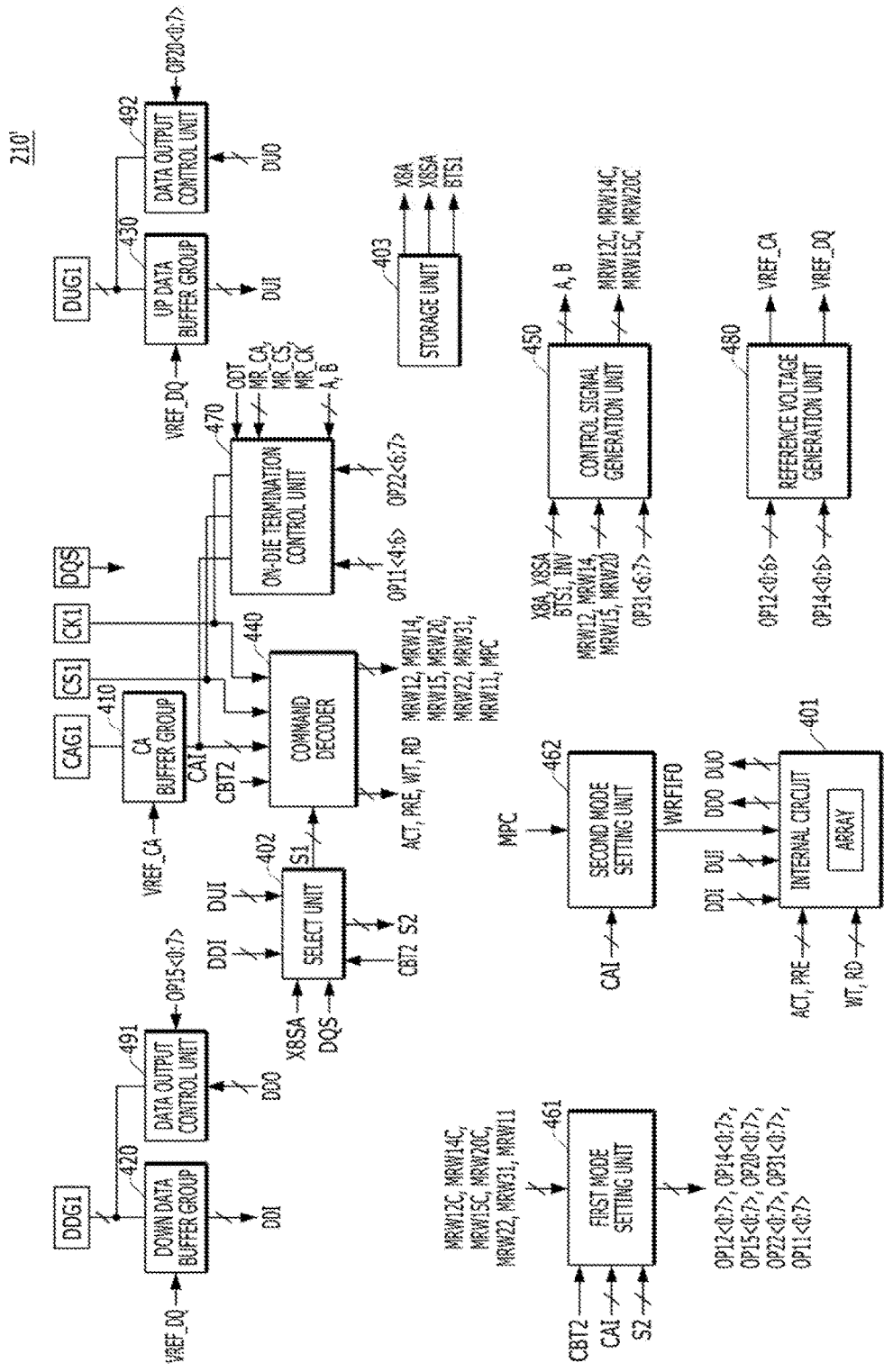
FIG. 19 is a diagram illustrating a first semiconductor chip in accordance with another embodiment of the present invention.

FIG. 19 is a diagram Illustrating a first semiconductor chip 210' in accordance with another embodiment of the present invention.

Unlike the first semiconductor chip 210 of FIG. 2, the semiconductor chip 210' Illustrated in FIG. 19 may store, in a storage unit 403, information to be received through a coupling information pad BTS1, an X8 pad X8A and an X8S pad X8SA, and may perform the same operation as the first semiconductor chip 210 of FIG. 4 using information (BTS1, X8A and X8SA) stored in the storage unit 403. The storage unit 403 may be any one of a fuse circuit, a non-volatile memory circuit such as a ROM (Read Only Memory), a NOR flash memory, a NAND flash memory, a PRAM (Phase Change Random Access Memory), a RRAM (Resistive Random Access Memory), an STTRAM (Spin Transfer Torque Random Access Memory), or an MRAM (Magnetic Random Access Memory), or various circuits for performing a like function and storing data.

The power supply voltage VDD may correspond both to a high level and to logical value '1'. The ground voltage VSS may correspond both to a low level and to logical value '0'.

Various embodiments provide a semiconductor system in which different setting information may be stored in two or more semiconductor chips that share CA information.

Also, various embodiments provide a semiconductor system which appropriately set an operation mode depending both on an external data channel coupled with each semiconductor chip and on a data pad group of each semiconductor chip that is coupled with an external data channel.

Although various embodiments have been described for illustrative purposes, it will be apparent to those skilled in the art that various changes and modifications may be made without departing from the spirit and scope of the invention as defined in the following claims.

What is claimed is:

1. A semiconductor system comprising:
an external channel including a command/address (CA) channel, and first and second data channels; and
first and second semiconductor chips which are coupled in common to the CA channel, coupled to respective different ones of the first and second data channels, and include respective coupling information pads in which different values from each other are inputted,
wherein each of the first and second semiconductor chips selectively stores setting information based on CA information applied to the CA channel and the value inputted to the corresponding coupling information pad,
wherein the first semiconductor chip comprises:
a plurality of first CA pads coupled to the CA channel; and
a plurality of first CA buffers, each configured to buffer, using a first CA reference voltage, a signal inputted to a corresponding one of the plurality of first CA pads, and
wherein the second semiconductor chip comprises:
a plurality of second CA pads coupled to the CA channel; and
a plurality of second CA buffers, each configured to buffer, using a second CA reference voltage, a signal inputted to a corresponding one of the plurality of second CA pads.

2. The semiconductor system of claim 1,
wherein one of the first and second semiconductor chips disables an on-die termination function thereof based on the CA information and the value inputted to the corresponding coupling information pad, and the other semiconductor chip enables an on-die termination function thereof based on the CA information and the value inputted to the corresponding coupling information pad.

3. The semiconductor system of claim 1, wherein
a first value is inputted to the coupling information pad of one of the first and second semiconductor chips, which is coupled to the first data channel, and a second value is inputted to the coupling information pad of the other semiconductor chip which is coupled to the second data channel.

4. The semiconductor system of claim 3,
wherein, when a first storage mode is set, one of the first and second semiconductor chips, which receives the first value through the corresponding coupling information pad, is enabled, and the other semiconductor chip that receives the second value is disabled,
wherein, when a second storage mode is set, one of the first and second semiconductor chips, which receives the second value through the corresponding coupling information pad, is enabled, and the other semiconductor chip that receives the first value is disabled, and
wherein the setting information applied to the first and second semiconductor chips through the CA channel is stored in only an enabled one of the first and second semiconductor chips.

5. The semiconductor system of claim 1,
wherein a first CA training operation is an operation for detecting optimum levels of the first and second CA reference voltages at which valid data windows of the CA information are maximized, and
wherein, during the first CA training operation, each of the first and second semiconductor chips repeatedly performs an operation for receiving the setting information through the CA channel, setting a level of a corresponding one of the first and second CA reference voltages, and entering a test mode, and receiving and storing the CA information, outputting the stored CA information to one of the first and second data channels, which is coupled with the corresponding semiconductor chip, and exiting the test mode.

6. The semiconductor system of claim 5, wherein the first and second semiconductor chips are selectively enabled based on the CA information and the values inputted to the respective coupling information pads, and respectively store first setting information corresponding to an optimum level of the first CA reference voltage and second setting information corresponding to an optimum level of the second CA reference voltage.

7. The semiconductor system of claim 1,
wherein a second CA training operation is an operation for detecting optimum levels of the first and second CA reference voltages at which valid data windows of the CA information are maximized, and
wherein, during the second CA training operation, each of the first and second semiconductor chips repeatedly performs, after entering a test mode, an operation for receiving the setting information through one of the first and second data channels, which is coupled with the corresponding semiconductor chip, and setting a level of a corresponding one of the first and second CA reference voltages, and receiving and storing the CA information, and outputting the stored CA information to one of the first and second data channels, which is coupled with the corresponding semiconductor chip, and then exits the test mode.

8. The semiconductor system of claim 7, wherein the first and second semiconductor chips are selectively enabled based on the CA information and the values inputted to the respective coupling information pads, and respectively store first setting information corresponding to an optimum level of the first CA reference voltage and second setting information corresponding to an optimum level of the second CA reference voltage.

9. The semiconductor system of claim 1,
wherein the first semiconductor chip comprises:
a plurality of first down and first up data pads; and
a plurality of first data buffers, each configured to buffer, using a first data reference voltage, a signal inputted to a corresponding one of the plurality of first down and first up data pads, and
wherein the second semiconductor chip comprises:
a plurality of second down and second up data pads; and
a plurality of second data buffers, each configured to buffer, using a second data reference voltage, a signal inputted to a corresponding one of the plurality of second down and second up data pads, and
wherein the plurality of first down data pads are coupled to the first data channel, and the plurality of second up data pads are coupled to the second data channel, or the plurality of first down data pads are coupled to the second data channel, and the plurality of second up data pads are coupled to the first data channel.

10. The semiconductor system of claim 9,
wherein a write training operation is an operation for detecting optimum levels of the first and second data reference voltages at which valid windows of data to be inputted to the first and second semiconductor chips through the first and second data channels are maximized, and wherein, during the write training operation, each of the first and second semiconductor chips repeatedly performs an operation for receiving the setting information through the CA channel and setting a level of a corresponding one of the first and second data reference voltages, and receiving and storing the data, outputting the stored data to one of the first and second data channels, which is coupled with the corresponding semiconductor chip, and changing an input time of the data or an input time of a data strobe.

11. The semiconductor system of claim 10, wherein the first and second semiconductor chips are selectively enabled based on the CA information and the values inputted to the respective coupling information pads, and respectively store first setting information corresponding to an optimum level of the first data reference voltage and second setting information corresponding to an optimum level of the second data reference voltage.

12. The semiconductor system of claim 9, wherein the first and second semiconductor chips respectively store first and second invert information, selectively invert data to be outputted to the plurality of first and second data pads in response to the first invert information, and selectively invert data to be outputted to the plurality of first and second data pads in response to the second invert information.

13. The semiconductor system of claim 12, wherein, when the plurality of first down data pads are coupled to the first data channel and the plurality of second up data pads are coupled to the second data channel, the first and second semiconductor chips store invert information inputted along with a first setting command as the first invert information, and store the invert information inputted along with a second setting command as the second invert information, and wherein, when the plurality of first down data pads are coupled to the second data channel and the plurality of second up data pads are coupled to the first data channel, the first and second semiconductor chips store the invert information inputted along with the first setting command as the second invert information, and store the invert information inputted along with the second setting command as the second invert information.

14. A semiconductor system comprising:

an external channel including a command/address (CA) channel, and first and second data channels; and first and second semiconductor chips which are coupled in common to the CA channel, coupled to respective different ones of the first and second data channels, and include respective coupling information pads in which different values from each other are inputted, wherein each of the first and second semiconductor chips includes a plurality of mode register sets, and selectively stores, in one of the mode register sets, setting information based on CA information applied to the CA channel and the value inputted to the corresponding coupling information pad, wherein the first semiconductor chip comprises:
a plurality of CA pads coupled to the CA channel; and
a plurality of first CA buffers, each configured to buffer, using a first CA reference voltage, a signal inputted to a corresponding one of the plurality of first CA pads, and wherein the second semiconductor chip comprises:
a plurality of second CA pads coupled to the CA channel; and
a plurality of second CA buffers, each configured to buffer, using a second CA reference voltage, a signal inputted to a corresponding one of the plurality of second CA pads.

15. The semiconductor system of claim 14, wherein the plurality of mode register sets comprise:

an on-die termination mode register set, a CA reference voltage mode register set, a data reference voltage mode register set, a reference voltage setting mode register set, a first output data invert mode register set, and a second output data invert mode register set.

16. The semiconductor system of claim 15, wherein, when identical setting information is stored in the on-die termination mode register sets of the first and second semiconductor chips, depending on the values inputted to the coupling information pads of the first and second semiconductor chips, an on-die termination function of one of the first and second semiconductor chips is enabled, and the on-die termination function of the other semiconductor chip is disabled.

17. The semiconductor system of claim 15, wherein a level of the first CA reference voltage is controlled depending on a value stored in the CA reference voltage mode register set of the first semiconductor chip, wherein a level of the second CA reference voltage is controlled depending on a value stored in the CA reference voltage mode register set of the second semiconductor chip.

18. The semiconductor system of claim 17, wherein a first CA training operation is an operation for detecting optimum levels of the first and second CA reference voltages at which valid data windows of the CA information are maximized, and wherein, during the first CA training operation, each of the first and second semiconductor chips repeatedly performs an operation for receiving the setting information through the CA channel and storing the setting formation in the CA reference voltage mode register set, and entering a test mode, and receiving and storing the CA information, outputting the stored CA information to one of the first and second data channels, which is coupled with the corresponding semiconductor chip, and exiting the test mode.

19. The semiconductor system of claim 18, wherein each of the first and second semiconductor chips stores a first setting value in the reference voltage setting mode register set, and the first semiconductor chip that is selected based on the first setting value and the value inputted to the corresponding coupling information pad stores first setting information in the corresponding CA reference voltage mode register set, and wherein each of the first and second semiconductor chips stores a second setting value in the reference voltage setting mode register set, and the second semiconductor chip that is selected based on the second setting value and the value inputted to the corresponding coupling information pad stores second setting information in the corresponding CA reference voltage mode register set.

20. The semiconductor system of claim 17, wherein a second CA training operation is an operation for detecting optimum levels of the first and second CA reference voltages at which valid data windows of the CA information are maximized, and wherein, during the second CA training operation, each of the first and second semiconductor chips repeatedly performs, after entering a test mode, an operation for receiving the setting information through one of the first and second data channels, which is coupled with the corresponding semiconductor chip, and storing the setting information in the CA reference voltage mode register set, and receiving and storing the CA information, and outputting the stored CA information to one of the first and second data channels, which is coupled with the corresponding semiconductor chip, and exits the test mode.

21. The semiconductor system of claim 20,
wherein each of the first and second semiconductor chips stores a first setting value in the reference voltage setting mode register set, and the first semiconductor chip that is selected based on the first setting value and the value inputted to the corresponding coupling information pad stores first setting information in the corresponding CA reference voltage mode register set, and
wherein each of the first and second semiconductor chips stores a second setting value in the reference voltage setting mode register set, and the second semiconductor chip that is selected based on the second setting value and the value inputted to the corresponding coupling information pad stores second setting information in the corresponding CA reference voltage mode register set.

22. The semiconductor system of claim 17,
wherein the first semiconductor chip comprises:
a plurality of first down and first up data pads; and
a plurality of first data buffers, each configured to buffer, using a first data reference voltage, a signal inputted to a corresponding one of the plurality of first down and first up data pads, and
wherein the second semiconductor chip comprises:
a plurality of second down and second up data pads; and
a plurality of second data buffers, each configured to buffer, using a second data reference voltage, a signal inputted to a corresponding one of the plurality of second down and second up data pads, and
wherein the plurality of first down data pads are coupled to the first data channel, and the plurality of second up data pads are coupled to the second data channel, or the plurality of first down data pads are coupled to the second data channel, and the plurality of second up data pads are coupled to the first data channel.

23. The semiconductor system of claim 22,
wherein a write training operation is an operation for detecting optimum levels of the first and second data reference voltages at which valid windows of data to be inputted to the first and second semiconductor chips through the first and second data channels are maximized, and
wherein, during the write training operation, each of the first and second semiconductor chips repeatedly performs an operation of receiving the setting information through the CA channel and storing the setting information in the data reference voltage mode register set, and entering a test mode, and receiving and storing the data, outputting the stored data to one of the first and second data channels, which is coupled with the corresponding semiconductor chip, and changing an input time of the data or an input time of a data strobe.

24. The semiconductor system of claim 23,
wherein each of the first and second semiconductor chips stores a first setting value in the reference voltage setting mode register set, and the first semiconductor chip that is selected based on the first setting value and the value inputted to the corresponding coupling information pad stores first setting information in the corresponding data reference voltage mode register set, and
wherein each of the first and second semiconductor chips stores a second setting value in the reference voltage setting mode register set, and the second semiconductor chip that is selected based on the second setting value and the value inputted to the corresponding coupling information pad stores second setting information in the corresponding data reference voltage mode register set.

25. The semiconductor system of claim 17, wherein the first and second semiconductor chips store invert information in the first and second output data invert mode register sets, selectively invert data to be outputted to the plurality of first and second down data pads depending on a value stored in the first output data invert mode register set, and selectively invert data to be outputted to the first and second up data pads which are inverted depending on a value stored in the second output data invert mode register set.

26. The semiconductor system of claim 25,
wherein, when the plurality of first down data pads are coupled to the first data channel and the plurality of second up data pads are coupled to the second data channel, the first and second semiconductor chips store the invert information inputted along with a first setting command in the first output data invert mode register set, and store the invert information inputted along with a second setting command in the second output data invert mode register set, and
wherein, when the plurality of first down data pads are coupled to the second data channel and the plurality of second up data pads are coupled to the first data channel, the first and second semiconductor chips store the invert information inputted along with the first setting command in the second output data invert mode register set, and store the invert information inputted along with the second setting command in the first output data invert mode register set.

* * * * *